(12) United States Patent
Lee et al.

(10) Patent No.: US 10,746,920 B2
(45) Date of Patent: Aug. 18, 2020

(54) DISPLAY DEVICE HAVING A BUFFER MEMBER BETWEEN LIGHT GUIDE PLATE AND CHASSIS

(71) Applicant: SAMSUNG DISPLAY CO., LTD., Yongin-si, Gyeonggi-Do (KR)

(72) Inventors: Jee Na Lee, Anyang-si (KR); Sang Woon Jung, Seongnam-si (KR); Man Soo Kim, Asan-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 47 days.

(21) Appl. No.: 16/138,102

(22) Filed: Sep. 21, 2018

(65) Prior Publication Data

US 2019/0154906 A1 May 23, 2019

(30) Foreign Application Priority Data

Nov. 20, 2017 (KR) ........................ 10-2017-0154684

(51) Int. Cl.

| | | |
|---|---|---|
| G02F 1/13357 | (2006.01) | |
| F21V 8/00 | (2006.01) | |
| H05K 1/18 | (2006.01) | |
| G02F 1/1333 | (2006.01) | |

(52) U.S. Cl.
CPC ......... *G02B 6/0088* (2013.01); *G02B 6/0031* (2013.01); *G02B 6/0055* (2013.01); *G02F 1/133308* (2013.01); *H05K 1/18* (2013.01); *G02B 6/005* (2013.01)

(58) Field of Classification Search
CPC .... G02B 6/0088; G02B 6/0093; G02B 6/056; G02B 6/0031; G02B 6/0073; G02B 6/0086; G02F 1/133615; F21V 2200/20
See application file for complete search history.

(56) References Cited

U.S. PATENT DOCUMENTS

| | | | | |
|---|---|---|---|---|
| 5,027,258 A | * | 6/1991 | Schoniger | G02B 6/0023 362/629 |
| 5,485,354 A | * | 1/1996 | Ciupke | G02B 6/0038 349/62 |
| 6,174,064 B1 | * | 1/2001 | Kalantar | G02B 6/0036 362/23.15 |
| 6,243,150 B1 | * | 6/2001 | Watanabe | G02B 6/0031 349/12 |

(Continued)

FOREIGN PATENT DOCUMENTS

| | | |
|---|---|---|
| KR | 10-2011-0119361 | 11/2011 |
| KR | 10-2014-0115924 | 10/2014 |
| KR | 10-2017-0090544 | 8/2017 |

*Primary Examiner* — Ismael Negron
(74) *Attorney, Agent, or Firm* — F. Chau & Associates, LLC

(57) ABSTRACT

A display device includes an inorganic light guide plate; a lower chassis includes a bottom portion overlapping the light guide plate, a first sidewall facing a first side surface of the light guide plate, and a second sidewall extending from the bottom portion and facing a second, side surface of the guide plate; a light source on the first sidewall and facing the first side surface; a display panel structure on the light guide plate and coupled to the lower chassis via a first panel coupling member; at least a first buffer member between the second sidewall and the second side surface; and a first reflective member between the first buffer member and the second side surface.

18 Claims, 30 Drawing Sheets

(56) References Cited

U.S. PATENT DOCUMENTS

| | | | |
|---|---|---|---|
| 6,426,807 B1* | 7/2002 | Kawai | G02B 6/0001 |
| | | | 358/484 |
| 8,573,826 B2* | 11/2013 | Chang | G02B 6/0025 |
| | | | 362/609 |
| 8,752,992 B2* | 6/2014 | Chen | F21V 13/14 |
| | | | 362/608 |
| 8,783,931 B2* | 7/2014 | McCollum | G02B 6/0031 |
| | | | 362/231 |
| 8,834,002 B2 | 9/2014 | Zhou | |
| 8,913,211 B2* | 12/2014 | Park | G02B 6/0088 |
| | | | 349/58 |
| 9,188,800 B2 | 11/2015 | Yu | |
| 9,817,182 B2* | 11/2017 | Choi | G02B 6/0091 |
| 10,078,176 B2* | 9/2018 | Takada | G02B 6/0083 |
| 2006/0250820 A1* | 11/2006 | Kuo | G02B 6/0031 |
| | | | 362/623 |
| 2014/0140094 A1* | 5/2014 | Miyao | G02B 6/0055 |
| | | | 362/609 |
| 2017/0086296 A1 | 3/2017 | Lee et al. | |

* cited by examiner

US 10,746,920 B2

DISPLAY DEVICE HAVING A BUFFER MEMBER BETWEEN LIGHT GUIDE PLATE AND CHASSIS

This application claims priority to Korean Patent Application No. 10-2017-0154684, filed on Nov. 20, 2017, and all the benefits accruing therefrom under 35 U.S.C. § 119, the disclosure of which is incorporated by reference herein in its entirety.

BACKGROUND

Technical Field

The present disclosure relates to a display device and, more specifically, to a display device having a buffered light guide plate.

Discussion of the Related Art

In a non-emissive display device such as a liquid crystal display (LCD) device, a display panel does not emit light itself and must rely on a backlight unit in order to display an image. The backlight unit includes light sources and may also include a light guide plate. The light guide plate may guide light emitted from the light sources and may also induce surface emission so that light is evenly provided along the entire display panel.

Recently, the need for research and development not only in the technical aspects, but also in the design aspects, of the LCD device, has been increasingly emphasized to better appeal to consumers. Accordingly, various attempts have been made to slim down the thickness of the LCD device and reduce the bezel width of the LCD device.

SUMMARY

A display device includes a light guide plate. The light guide plate has a first side surface and a second side surface. The light guide plate includes an inorganic material. A lower chassis includes a bottom portion, which overlaps with the light guide plate, a first sidewall, which faces the first side surface of the light guide plate, and a second sidewall, which extends from the bottom portion and faces the second side surface of the light guide plate. A light source is disposed on the first sidewall and faces the first side surface of the light guide plate. A display panel structure is disposed on the light guide plate and is coupled to the lower chassis via a first panel coupling member. The display panel structure includes a display panel. A first buffer member is disposed between the second sidewall and the second side surface of the light guide plate. A first reflective member is disposed between the first buffer member and the second side surface of the light guide plate.

A display device includes a light guide plate having a first side surface and a second side surface. The light guide plate includes an inorganic material. A lower chassis includes a bottom portion, which overlaps with the light guide plate, a first sidewall, which faces the first side surface of the light guide plate, and a second sidewall, which extends from the bottom portion and faces the second side surface of the light guide plate. A light source is disposed on the first sidewall and faces the first side surface of the light guide plate. A display panel structure is disposed on the light guide plate. The display panel structure is coupled to the lower chassis via a panel coupling member. The display panel structure includes a display panel. A buffer member is disposed between the second sidewall and the second side surface of the light guide plate and is configured to reflect light emitted from the second side surface of the light guide plate.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION

Figure 1:
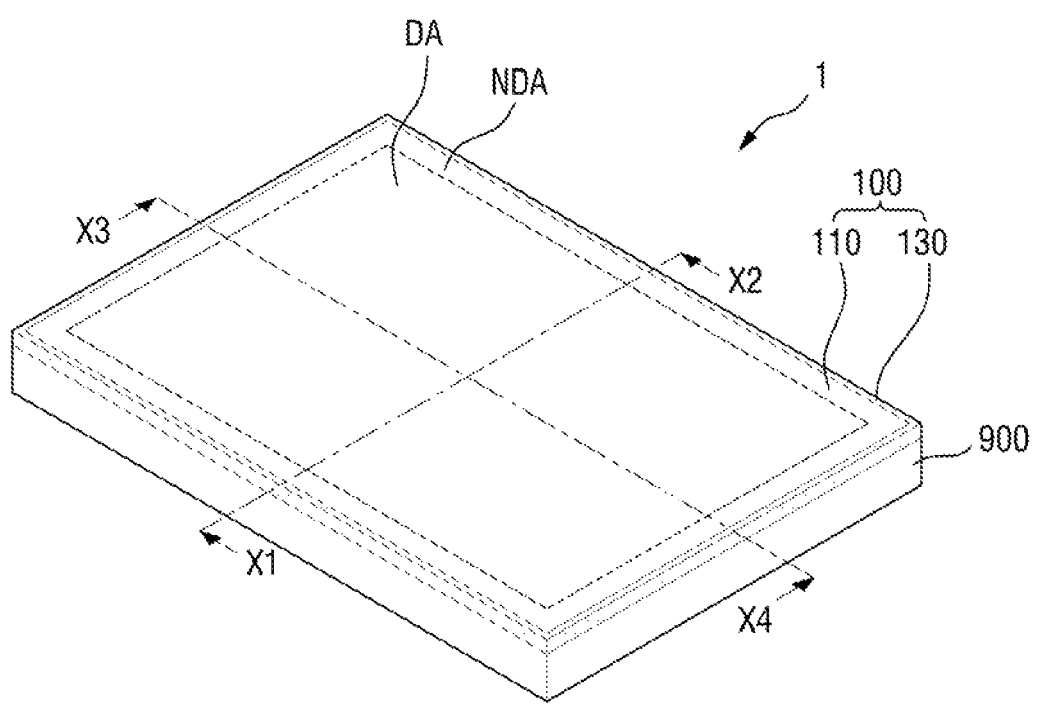
FIG. 1 is a perspective view illustrating a display device according to an exemplary embodiment of the present disclosure.
Figure 1:
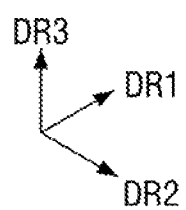

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

In the disclosure and the figures, the same reference numbers may indicate the same or corresponding components. In the figures, the thickness of layers and regions may be exaggerated for clarity.

It will also be understood that when a layer is referred to as being "on" another layer or substrate, it can be directly on the other layer or substrate, or intervening layers may also be present.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element might not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

Exemplary embodiments of the present disclosure will hereinafter be described with reference to the accompanying drawings.

FIG. 1 is a perspective view illustrating a display device according to an exemplary embodiment of the present disclosure.

Referring to FIG. 1, a display device 1 may be applicable to various electronic devices such as a personal computer (PC), a tablet computer, a smartphone, a car navigation unit, a camera, a central information display (CID) provided in an automobile, a wristwatch-type electronic device or other wearable device, a personal digital assistant (PDA), a portable multimedia player (PMP), a small- or medium-sized electronic device such as a gaming device, a television (TV), an external billboard, a monitor, and/or a notebook computer, but the present disclosure is not limited thereto. For example, the display device 1 may also be applicable to various electronic devices other than those set forth herein.

In some exemplary embodiments of the present disclosure, the display device 1 may have a rectangular shape in a plan view. The display device 1 may have two relatively short sides extending in a first direction DR1 and two relatively long sides extending in a second direction DR2 that is perpendicular to the first direction DR1. The corners where the long sides and the short sides of the display device 1 meet may be curved/rounded. The planar shape of the display device 1 need not be rectangular, and may be another polygon, a circle, or any other arbitrary shape.

The display device 1 has a display area DA and a non-display area NDA and may display an image in the display area DA. The non-display area NDA may be dispose on a periphery of the display area DA.

Figure 2:
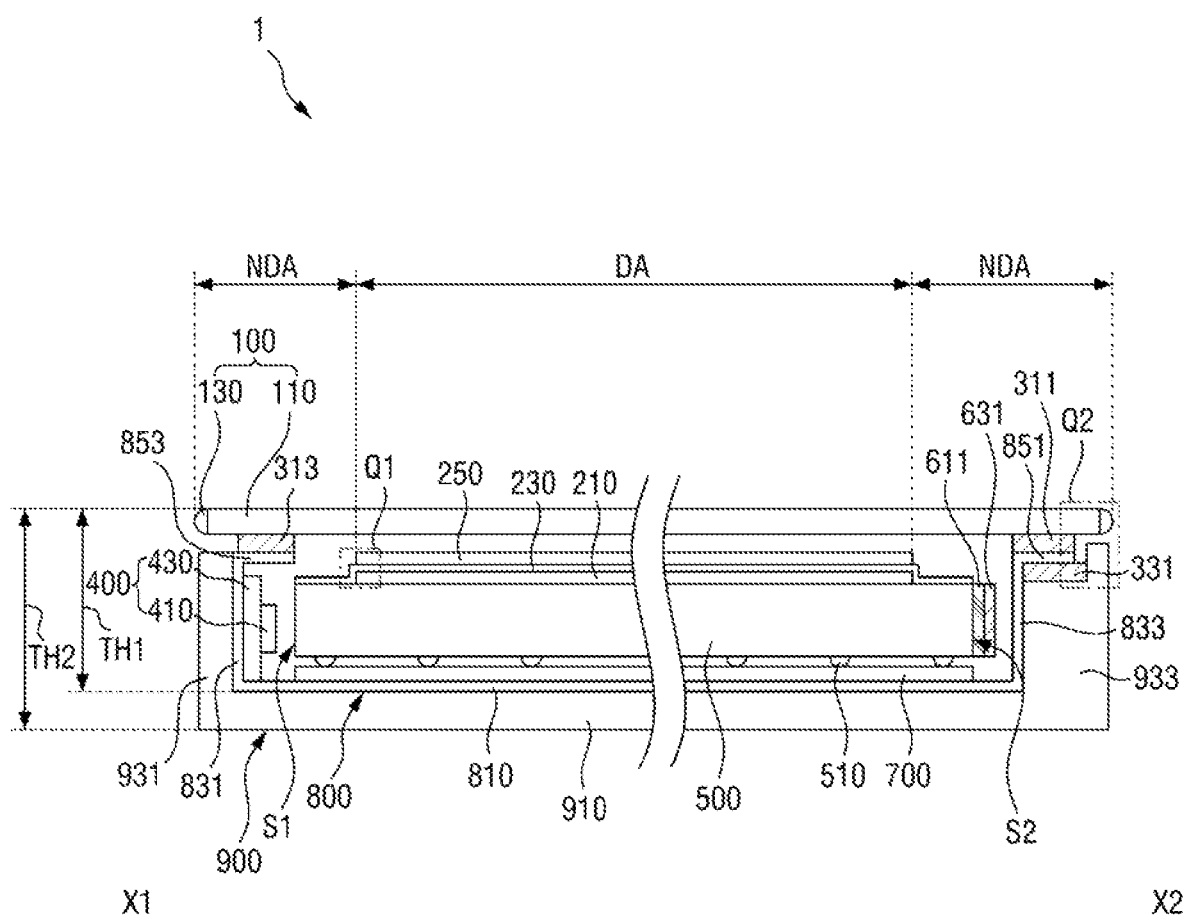
FIG. 2 is a cross-sectional view, taken along line X1-X2 of FIG. 1, of the display device of FIG. 1.
Figure 3:
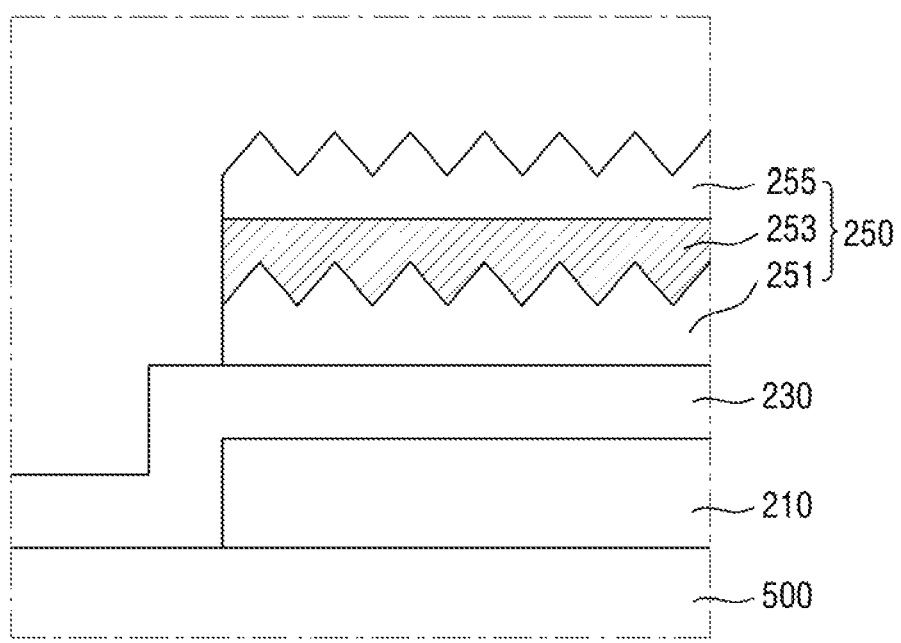
FIG. 3 is an enlarged cross-sectional view of an area Q1 of FIG. 2.
Figure 4:
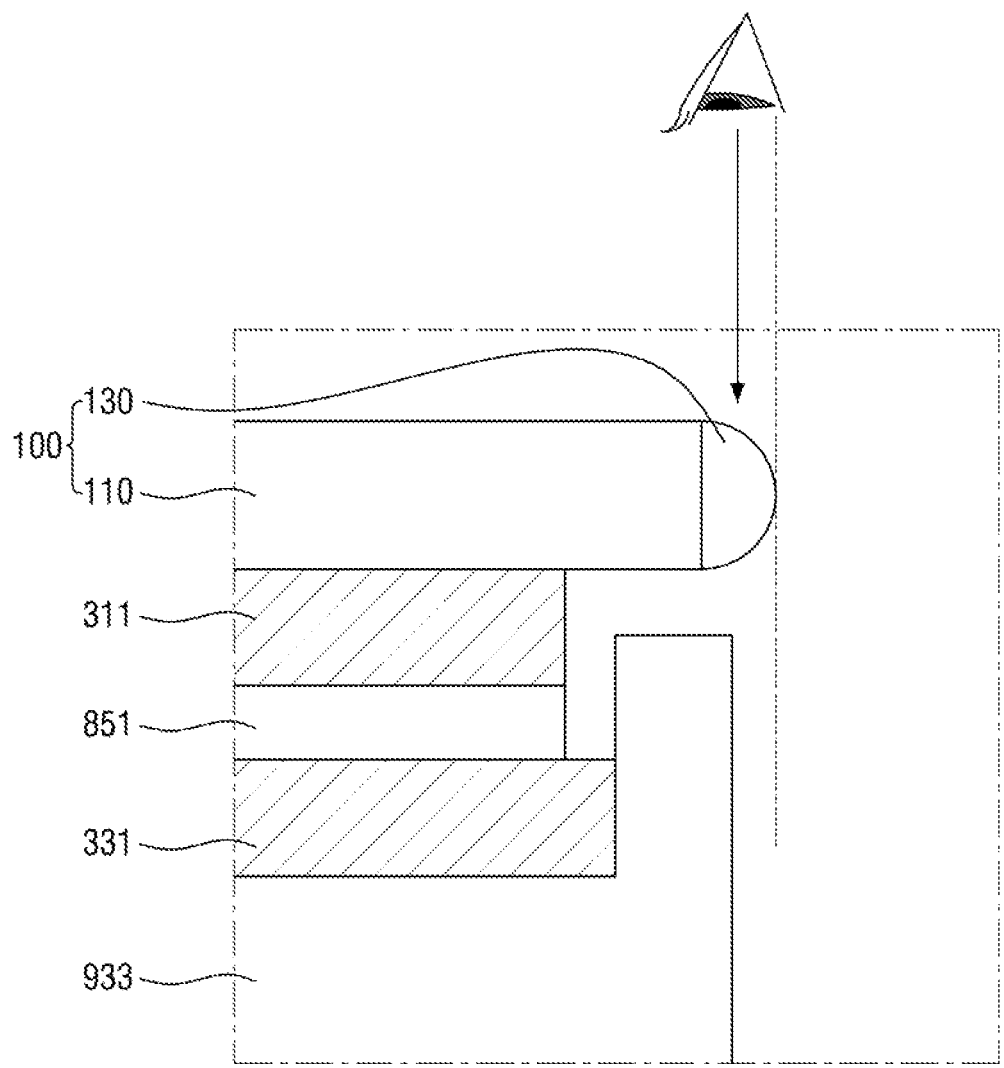
FIG. 4 is an enlarged cross-sectional view of an area Q2 of FIG. 2.
Figure 5:
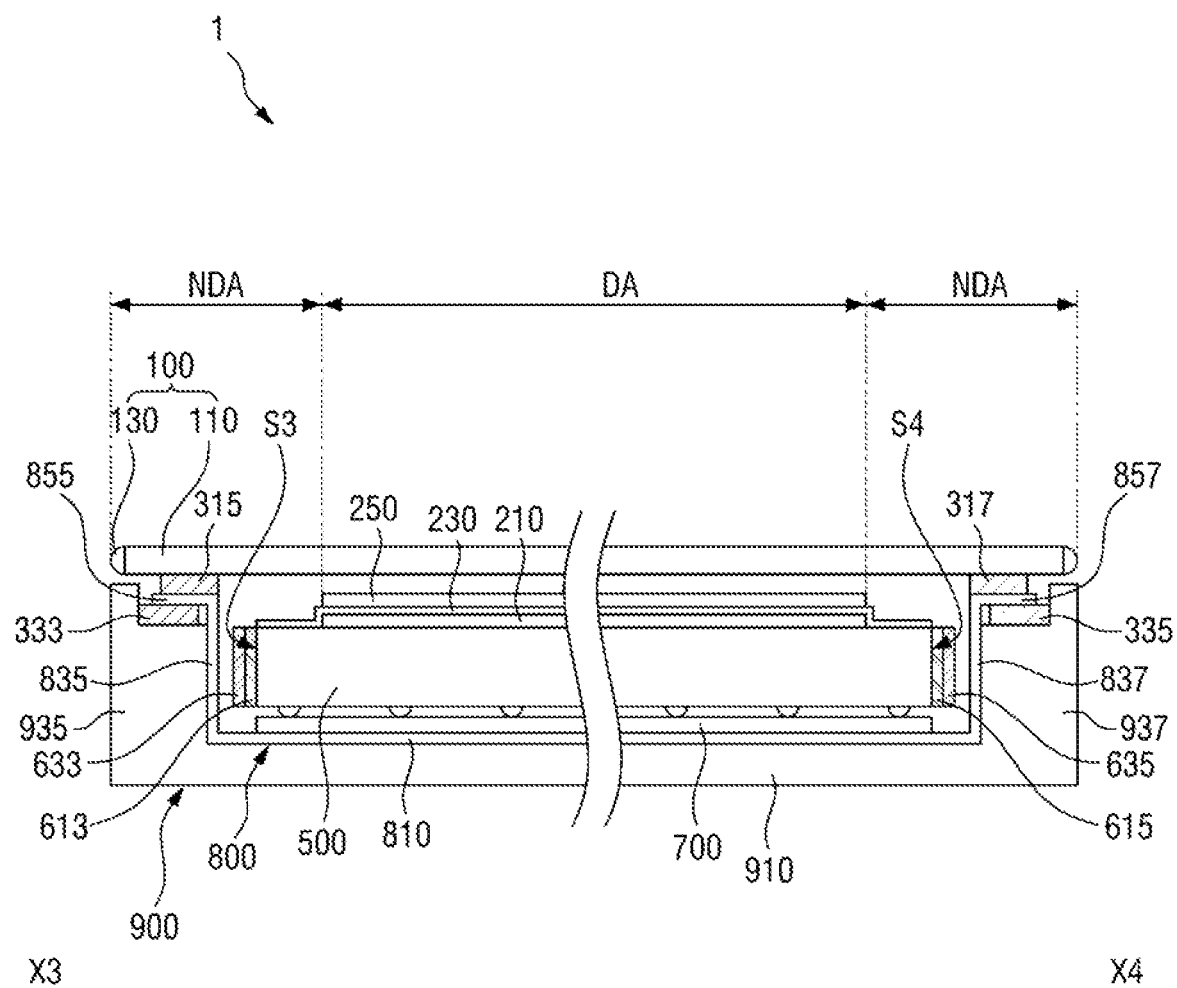
FIG. 5 is a cross-sectional view, taken along line X3-X4 of FIG. 1, of the display device of FIG. 1.
Figure 6:
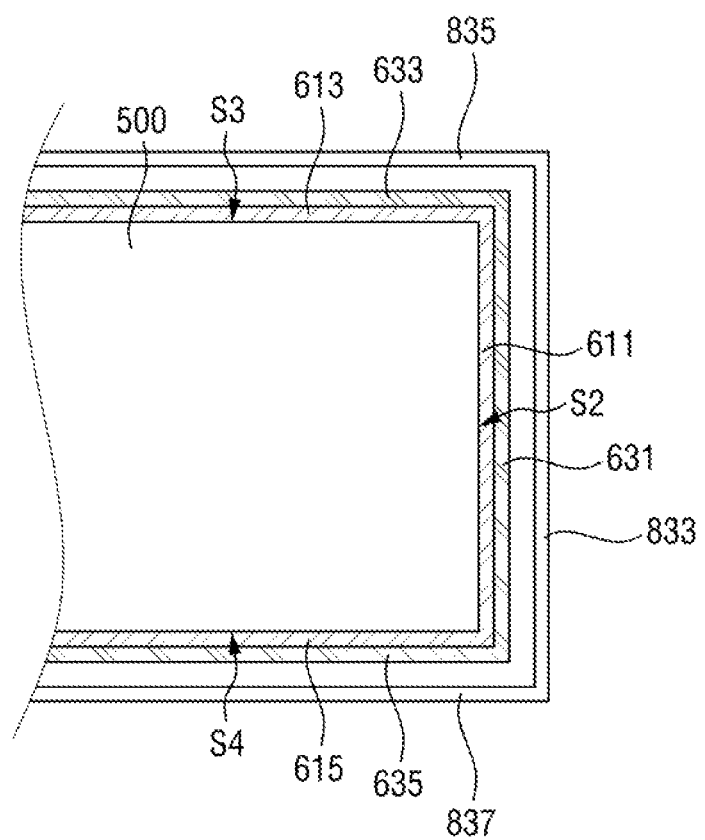
FIG. 6 is a plan view illustrating an arrangement of a light guide plate, the sidewalls of a lower chassis, reflective members, and buffer members in the display device of FIGS. 2 through 5.
Figure 6:
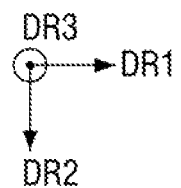
Figure 7:
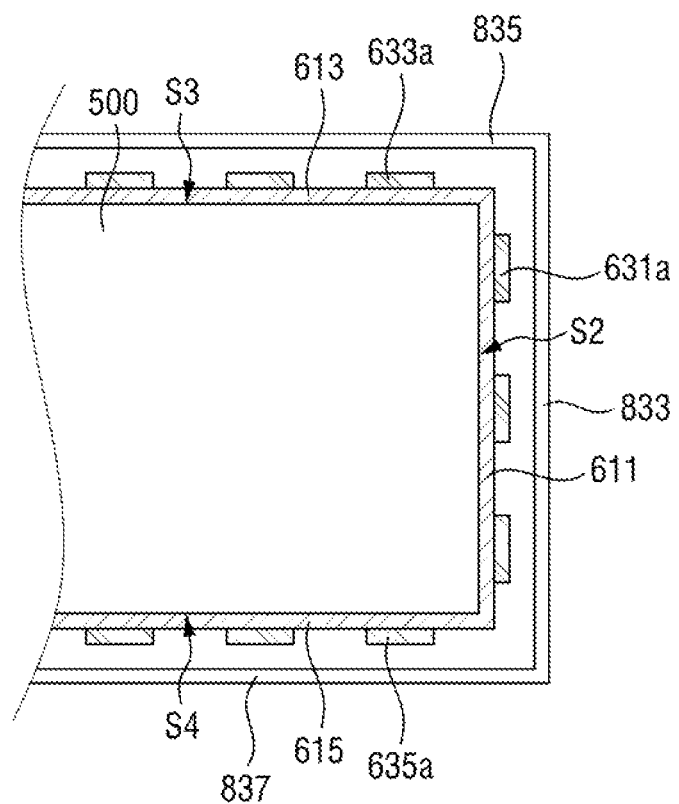
FIG. 7 is a plan view illustrating a modified example of FIG. 6.
Figure 7:
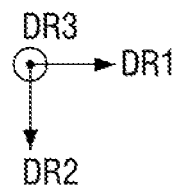

FIG. 2 is a cross-sectional view, taken along line X1-X2 of FIG. 1, of the display device of FIG. 1. FIG. 3 is an enlarged cross-sectional view of an area Q1 of FIG. 2. FIG. 4 is an enlarged cross-sectional view of an area Q2 of FIG. 2. FIG. 5 is a cross-sectional view, taken along line X3-X4 of FIG. 1, of the display device of FIG. 1. FIG. 6 is a plan view illustrating the arrangement of a light guide plate, the sidewalls of a lower chassis, reflective members, and buffer members in the display device of FIGS. 2 through 5. FIG. 7 is a plan view illustrating a modified example of FIG. 6.

Referring again to FIG. 1 and further to FIGS. 2 through 7, the display device 1 includes a display panel structure 100, a light source member 400, a light guide plate 500, a lower chassis 800, a first reflective member 611, a first buffer member 631, and a first panel coupling member 311.

The display device 1 may further include a housing 900, a reflective layer 700, a wavelength conversion layer 210, a passivation layer 230, an optical function layer 250, a second buffer member 633 (FIG. 5), a third buffer member 635 (FIG. 5), a second reflective member 613 (FIG. 5), a third reflective member 615 (FIG. 5), a second panel coupling member 313, a third panel coupling member 315 (FIG. 5), a first housing coupling member 331, a second housing coupling member 333 (FIG. 5), and a third housing coupling member 335 (FIG. 5).

Unless otherwise defined, the terms "above", "upper side", "upper", "top", and "top surface", as used herein, denote a display surface's side with respect to the display panel structure 100, e.g., the top side in the accompanying drawings or the side represented by an arrow indicating a third direction DR3. The terms "below", "lower side", "lower", "bottom", and "bottom surface", as used herein, denote the opposite side to the display surface's side with respect to the display panel structure 100, e.g., the bottom side in the accompanying drawings or the opposite side to the side represented by the arrow indicating the third direction DR3.

The display panel structure 100 may have the display area DA and the non-display area NDA. The display area DA is an area in which an image is displayed, and the non-display area NDA is an area which is disposed adjacent to the display area DA in which no image is displayed. In some exemplary embodiments, the non-display area NDA may be disposed to surround the display area DA on one or more sides thereof. For example, the non-display area NDA may fully surround the display area DA on all four planar sides thereof.

The display panel structure 100 includes a display panel 110 and a panel protection member 130, which is disposed along the sides of the display panel 110 so as to frame the display panel 110.

The display panel 110 generates an image, corresponding to input image data, using light provided by the light guide plate 500. Examples of a light-receiving display panel include a liquid crystal display (LCD) panel and an electrophoretic panel. The display panel 110 will hereinafter be described as being, for example, an LCD panel, but the present disclosure is not limited thereto. For example, various light-receiving display panels other than an LCD panel are applicable to the display panel 110 discussed herein.

The panel protection member 130 may be disposed along the sides of the display panel 110. The panel protection member 130 protects the sides or the edges of the display panel 110. The panel protection member 130 may be formed of a silicone-based or ultraviolet (UV) cured sealant (or resin). The panel protection member 130 may be colorless (or transparent) or colored (for example, blue, red, or black) depending on the design of the display device 1, but the present disclosure is not limited thereto. In some exemplary embodiments of the present invention, the panel protection member 130 may be formed of a colored resin or a light-blocking resin to prevent light leakage on the sides of the display panel 110.

The light guide plate 500 is disposed below the display panel structure 100 such that the light guide plate 500 does not obstruct viewing of the display panel structure 100.

The light guide plate 500 guides light provided by one or more light sources 410 of the light source member 400 toward the display panel 110. The light guide plate 500 may be shaped substantially as a polygonal column. The planar shape of the light guide plate 500 may be rectangular, but the present disclosure is not limited thereto. In one exemplary embodiment of the present disclosure, the light guide plate 500 may be in the shape of a hexagonal column having a rectangular planar shape, and may have a top surface, a bottom surface, and four side surfaces (S1 through S4). The four side surfaces (S1 through S4) include first, second, third, and fourth side surfaces S1, S2, S3, and S4. The first side surface S1 may be an incident surface upon which the light emitted by the light sources 410 is incident. The second side surface S2 may be opposite to the first side surface S1 and may be a counter surface opposite to the incident surface. The third side surface S3 may connect one end of the first side surface S1 to one end of the second side surface S2, and the fourth side surface S4 may connect the other end of the first side surface S1 and the other end of the second side surface S2.

In one exemplary embodiment of the present disclosure, the light guide plate 500 may generally have a uniform thickness, but the present disclosure is not limited thereto. For example, the light guide plate 500 may be in a wedge shape so that its thickness may gradually decrease from the first side surface S1 to the second side surface S2 opposite to the first side surface S1. Alternatively, the thickness of the light guide plate 500 may gradually decrease to a certain point and may then be uniformly maintained.

In some exemplary embodiments of the present disclosure, scattering patterns 510 may be disposed on the bottom surface of the light guide plate 500. The scattering patterns 510 change the angle of light traveling inside the light guide plate 500 through total reflection and thus discharge the light to the outside of the light guide plate 500.

In one exemplary embodiment of the present disclosure, the scattering patterns 510 may be provided as a separate layer or as separate patterns. For example, a pattern layer including protrusion patterns and/or concave groove patterns may be formed on the bottom surface of the light guide plate 500, or printed patterns may be formed on the bottom surface of the light guide plate 500 to serve as the scattering patterns 510.

According to an exemplary embodiment of the present disclosure, the scattering patterns 510 may be formed by surface shapes formed on the light guide plate 500. For example, concave grooves may be formed on the bottom surface of the light guide plate 500 to serve as the scattering patterns 510.

The light guide plate 500 may comprise an inorganic material. For example, the light guide plate 500 may be formed of a glass material. In a case where the light guide plate 500 is formed of a glass material, the permeation resistance of the light guide plate 500 for preventing the penetration of external moisture and air can be increased. Also, in a case where the light guide plate 500 is formed of a glass material, the thermal expansion or contraction of the light guide plate 500 can be prevented due to the relatively low thermal expansion coefficient of glass materials. Also, in a case where the light guide plate 500 is formed of a glass material, the light guide plate 500 can protect the wavelength conversion layer 210 against heat because glass materials tend to have a relatively low thermal conductivity. Also, in a case where the light guide plate 500 is formed of a glass material, the hardness of the light guide plate 500 can be increased because an inorganic material such as glass may be harder than an organic material such as a plastic material. Therefore, even if the display device 1 is not equipped with a separate structure for preventing any deformation, the deformation of the display device 1 can be prevented due to the hardness of the light guide plate 500. A thickness TH1 measured from the rear surface of the lower chassis 800 to the top surface of the display panel structure 100 can be reduced, and as a result, a total thickness TH2 of the display device 1 can be reduced.

The light source member 400 may be disposed adjacent to at least one side of the light guide plate 500. The light guide member 400 may include the one or more light sources 410 and a printed circuit board (PCB) 430. The light sources 410 may be mounted on the PCB 430 and may receive a driving voltage from the PCB 430. The light sources 410 provided with the driving voltage may provide light to the light guide plate 500. The light sources 410 may include a plurality of dot light sources or a plurality of linear light sources. The dot light sources may be light-emitting diodes (LEDs). For example, the light sources 410 may be blue LEDs emitting light of a blue-wavelength.

In one exemplary embodiment of the present disclosure, the light sources 410 may be top-emitting LEDs emitting light from the top surfaces thereof, as illustrated in FIG. 2, in which is case, the PCB 430 may be disposed on a first side surface 831 of the lower chassis 800.

The light source member 400 is illustrated as being disposed adjacent to the first side surface S1, which corresponds to one long side of the light guide plate 500, but the present disclosure is not limited thereto. In one example, the light source member 400 may be disposed adjacent to both long sides of the light guide plate 500, for example, both the first and second side surfaces S1 and S2. According to an example, the light source member 400 may be disposed adjacent to one short side of the light guide plate 500, for example, the third side surface S3, or may be disposed adjacent to both short sides of the light guide plate 500, for example, both the third and fourth side surfaces S3 and S4. The light source member 400 will hereinafter be described as being disposed adjacent to the first side surface S1 of the light guide plate 500, but the present disclosure is not limited thereto.

The wavelength conversion layer 210 may be disposed on the top surface of the light guide plate 500. The wavelength conversion layer 210 converts the wavelength of at least some light incident thereupon. For example, the wavelength conversion layer 210 may convert at least some of the blue light to red light and green light. Alternatively, the wavelength conversion layer 210 may convert the light from the light source member 400 into white light. The wavelength conversion layer 210 may overlap with the display area DA of the display panel structure 100. In some exemplary embodiments of the present disclosure, part of the wavelength conversion layer 210 may further overlap with the non-display area NDA of the display panel structure 100.

The wavelength conversion layer 210 may include a binder layer and wavelength conversion particles dispersed in the binder layer. The wavelength conversion layer 210 may further include scattering particles dispersed in the binder layer.

The binder layer is a medium in which the wavelength conversion particles are dispersed, and the binder layer may comprise various resin compositions that are normally referred to as binders, but the present disclosure is not limited thereto. For example, any medium that can have the wavelength conversion particles and/or the scattering particles dispersed therein can be referred to as the binder layer regardless of its common name, additional functions, and ingredients.

The wavelength conversion particles are particles that convert the wavelength of incident light and may be, for example, quantum dots (QDs), a fluorescent material, or a phosphorescent material. The QDs, which are an example of a type of wavelength conversion particles, are a material having a crystal structure of several nanometers in size, composed of several hundreds to thousands of atoms, and exhibit a quantum confinement effect. Thus, as the size of the QDs decreases, the energy band gap of the QDs increases. When light having a wavelength greater than the energy band gap of the QDs is incident upon the QDs, the QDs absorb the light and are excited. Then, the QDs emit light of a particular wavelength as they relax back to a ground state. The light emitted by the QDs has a value corresponding to the energy band gap of the QDs. By controlling the size and the composition of the QDs, the emission properties of the QDs, resulting from the quantum confinement effect, can be controlled The QDs may comprise at least one of, for example, a Group II-VI compound, a Group II-V compound, a Group III-VI compound, a Group III-V compound, a Group IV-VI compound, a group I-III-VI compound, a Group II-IV-VI compound, and/or a Group II-IV-V compound.

The QDs may comprise a core and a shell overcoating the core. The core may comprise at least one of, for example, CdS, CdSe, CdTe, ZnS, ZnSe, ZnTe, GaN, GaP, GaAs, GaSb, AlN, AlP, AlAs, AlSb, InP, InAs, InSb, SiC, Ca, Se, In, P, Fe, Pt, Ni, Co, Al, Ag, Au, Cu, FePt, $Fe_2O_3$, $Fe_3O_4$, Si, and/or Ge, but the present disclosure is not limited thereto. The shell may comprise at least one of, for example, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, and/or PbTe, but the present disclosure is not limited thereto.

The wavelength conversion particles may include wavelength conversion particles converting the wavelength of incident light into different wavelengths. For example, the wavelength conversion particles include first wavelength conversion particles, which convert the wavelength of incident light into a first wavelength and emit the first wavelength, and second wavelength conversion particles, which convert the wavelength of the incident light into a second wavelength and emit the second wavelength. In one exemplary embodiment of the present disclosure, light emitted from the light sources 410 and incident upon the wavelength conversion particles may be light having a blue wavelength, the first wavelength may be a green wavelength, and the second wavelength may be a red wavelength. For example, the blue wavelength may have a peak in the range of 420 nm to 470 nm, the green wavelength may have a peak in the range of 520 nm to 570 nm, and the red wavelength may have a peak in the range of 620 nm to 670 nm. However, the blue, green, and red wavelengths are not particularly limited and may be understood as encompassing the ranges of wavelengths that can be perceived as blue, green, and red, respectively.

According to some exemplary embodiments of the present disclosure, some blue-wavelength light incident upon the wavelength conversion layer 210 may be incident upon the first wavelength conversion particles through the wavelength conversion layer 210 and may be converted into, and emitted as, green-wavelength light, other blue-wavelength light incident upon the wavelength conversion layer 210 may be incident upon the second wavelength conversion particles and may be converted into, and emitted as, red-wavelength light, and still other blue-wavelength light incident upon the wavelength conversion layer 210 may be emitted as blue-wavelength light, without being incident upon the first wavelength conversion particles and the second wavelength conversion particles. Light transmitted through the wavelength conversion layer 210 may include blue-wavelength light, green-wavelength light, and red-wavelength light. By appropriately controlling the ratio of emitted light of different wavelengths, white light or another color light may be displayed. Light converted by the wavelength conversion layer 210 is concentrated on a narrow range of wavelengths and has a sharp spectrum with a narrow half width. If colors are realized by filtering the light with the sharp spectrum using a color filter, color reproduction accuracy can be increased.

According to an exemplary embodiment of the present disclosure, short-wavelength light such as ultraviolet (UV) light may be provided as incident light, and three types of wavelength conversion particles may be provided in the wavelength conversion layer 210 to convert the wavelength of incident light into the blue, green, and red wavelengths and thereby emit white light.

The wavelength conversion layer 210 may further include the scattering particles. The scattering particles, which are not QD particles, may be particles having no wavelength conversion function. The scattering particles scatter incident light and may thus allow more light to be incident upon the wavelength conversion particles. Also, the scattering particles control the emission angle of light of different wavelengths to be uniform. For example, as some incident light is incident upon the wavelength conversion particles and is then converted and emitted by the wavelength conversion particles, the emission direction of the incident light may become random. If the scattering particles are not provided in the wavelength conversion layer 210, green- and red-wavelength light emitted after colliding with the wavelength conversion particles have scattering emission characteristics, but green- and red-wavelength light emitted without colliding with the wavelength conversion particles do not have scattering emission characteristics. As a result, blue-, green-, and red-wavelength light may be emitted by different amounts. The scattering particles can impart scattering emission characteristics even to blue-wavelength light that is emitted without first colliding with the wavelength conversion particles and can thus control the emission angle of light of different wavelengths to be more uniform. For example, $TiO_2$ and/or $SiO_2$ may be used as the scattering particles.

The wavelength conversion layer 210 may be formed by a coating method. For example, the wavelength conversion layer 210 may be formed by slit-coating a wavelength conversion composition on the light guide plate 500 and drying and curing the wavelength conversion composition. However, the present invention is not limited to this approach for forming the wavelength conversion layer 210. For example, alternatively, the wavelength conversion layer 210 may be formed by various deposition methods other than coating.

The passivation layer 230 is disposed on the wavelength conversion layer 210. The passivation layer 230 may prevent the penetration of moisture and/or oxygen. In some exemplary embodiments, the passivation layer 230 may comprise an inorganic material. For example, the passivation layer 230 may comprise silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, and/or a metal film that is capable to transmitting light. In one exemplary embodiment of the present disclosure, the passivation layer 230 may be formed of silicon nitride.

The passivation layer 230 may completely cover at least one side of the wavelength conversion layer 210. In one exemplary embodiment of the present disclosure, the passivation layer 230 may completely cover all sides of the wavelength conversion layer 210, but other arrangements may alternatively be used.

The passivation layer 230 may completely overlap with the wavelength conversion layer 210. The passivation layer 230 may cover the top surface of the wavelength conversion layer 210 and may extend further beyond the top surface of the wavelength conversion layer 210 to cover the sides of the wavelength conversion layer 210. In some exemplary embodiments of the present disclosure, part of the passivation layer 230 not covered by the wavelength conversion layer 210 may extend to the top surface of the light guide plate 500, and as a result, some of the edges of the passivation layer 230 may be placed in direct contact with the top surface of the light guide plate 500.

The wavelength conversion layer 210, particularly, the wavelength conversion particles included in the wavelength conversion layer 210, are susceptible to moisture and/or oxygen. In a wavelength conversion film, barrier films are laminated on the top and bottom surfaces of a wavelength conversion layer so as to prevent the penetration of moisture and/or oxygen. However, in the exemplary embodiment of FIG. 1, the wavelength conversion layer 230 is disposed directly on the light guide plate 500. Thus, a sealing structure for protecting the wavelength conversion layer 210 is needed instead of barrier films. The sealing structure may be realized by the passivation layer 230 and the light guide plate 500. Since the passivation layer 230 and the light guide plate 500 both comprise an inorganic material, inorganic-inorganic bonds are formed at the interface between the passivation layer 230 and the light guide plate 500. As a result, the penetration of moisture and/oxygen from the outside can be effectively prevented.

The passivation layer 230 may be formed by deposition. For example, the passivation layer 230 may be formed on the light guide plate 500 with the wavelength conversion layer 210 formed thereon using chemical vapor deposition (CVD), but the present disclosure is not limited thereto. For example, various deposition methods other than CVD may be used to form the passivation layer 230.

As mentioned above, the light guide plate 500 and the wavelength conversion layer 210 may be formed in one integral body with each other to perform both an optical guide function and a wavelength conversion function at the same time. By integrally forming the light guide plate 500 and the wavelength conversion layer 210, the assembly of the display device 1 can be simplified. Also, by sealing the wavelength conversion layer 210 with the passivation layer 230, the degradation of the wavelength conversion layer 210 can be prevented.

In the case of using a wavelength conversion film provided as a separate film, the manufacturing cost of a display device can be lowered, and the thickness of a display device can be reduced. The wavelength conversion film includes a wavelength conversion layer and barrier films laminated on the top and bottom surfaces of the wavelength conversion layer. However, the barrier films are expensive and are generally as thick as 100 μm, and thus, the wavelength conversion film is as thick as about 270 μm. In the exemplary embodiment of FIG. 1, the use of the barrier films is not needed. Thus, the manufacturing cost of the display device 1 can be further lowered, as compared to when using the wavelength conversion film.

The optical function layer 250 may be disposed on the passivation layer 230. The optical function layer 250 is a layer changing or controlling the traveling direction, phase, and polarization state of light. For example, the optical function layer 250 may perform the refraction, condensation, diffusion, scattering, reflective polarization, and/or phase retardation of light. The optical function layer 250 may be a layer performing the same optical functions as a prism film, a diffusion film, a micro-lens film, a lenticular film, a polarizing film, a reflective polarizing film, and a retardation film that may be provided as separate films. The optical function layer 250 may include structured optical patterns. The structured optical patterns have an uneven surface. The cross-sectional shape of the uneven surface may be, for example, polygonal such as triangular or trapezoidal, partially circular or elliptical, or amorphously random. The uneven surface may consist of line patterns extending in one direction or independent dot patterns, but the present disclosure is not limited thereto. Alternatively, the optical patterns, like a polarizing film or a reflective polarizing film, may have a flat surface.

In some exemplary embodiments of the present disclosure, the optical function layer 250 may include a first optical function layer 251, a low refractive layer 253, and a second optical function layer 255.

The first optical function layer 251 may be disposed on, and be in contact with, the passivation layer 230 to overlap with the wavelength conversion layer 210. In one exemplary embodiment of the present disclosure, the first optical function layer 251 may be placed in direct contact with the passivation layer 230. According to an exemplary embodiment of the present disclosure, the first optical function layer 251 may be disposed on the passivation layer 230 with a bonding layer interposed therebetween.

The first optical function layer 251 is illustrated as being a prism pattern layer, but various other optical function layers such as a micro-lens layer may be used as the first optical function layer 251. The refractive index of the first optical function layer 251 may be 1.5 to 1.8, but the first optical function layer 251 may have a refractive index outside of this range.

The second optical function layer 255 may be disposed above the first optical function layer 251, and the low refractive layer 253 may be interposed between the first and second optical function layers 251 and 255. The refractive index of the low refractive layer 253 may be lower than the refractive index of the first optical function layer 251. For example, the difference between the refractive index of the first optical function layer 251 and the refractive index of the low refractive layer 253 may be 0.2 or greater.

In a case where the first optical function layer 251 has a substantially uneven surface, the low refractive layer 253 may fill the unevenness on the surface of the first optical function layer 251. In this way, the low refractive layer 253 may planarize the first optical function layer 251. The low refractive layer 253 may fill all recesses of the first optical function layer 251 and may cover even protrusions of the first optical function layer 251. In one exemplary embodiment, the low refractive layer 253 may completely fill the space between the first and second optical function layers 251 and 255. The top surface of the low refractive layer 253 may be flat, but the present disclosure is not limited thereto.

The second optical function layer 255 is disposed on the top surface of the low refractive layer 253. The second optical function layer 255 may be formed of a material having a higher refractive index than the low refractive layer 253. For example, the second optical function layer 255 may have a refractive index of 1.5 to 1.8, but the second optical function layer 255 may have a refractive index outside of this range. The second optical function layer 255 may have the same refractive index as the first optical function layer 251.

The low refractive layer 253 contributes to the bonding of the first and second optical function layers 251 and 255 and the optical functions of the first and second optical function layers 251 and 255.

For example, since the low refractive layer 253 completely fills the space between the first and second optical function layers 251 and 255, the first and second optical function layers 251 and 255 can be mechanically and stably coupled to each other.

Also, by using a material having a lower refractive index than the first optical function layer 251 to form the low refractive layer 253, the optical functions of the first optical function layer 251 can be maintained. In general, the surfaces of the first and second optical function layers 251 and 255 have structured patterns in order to change the path of light through refraction or reflection. This type of optical modulation function presupposes that the first and second optical function layers 251 and 255 have a different refractive index from the medium adjacent to their surface. For example, if the low refractive layer 253 has a similar refractive index to the first optical function layer 251, the traveling direction of light minimally changes at the interface between the low refractive layer 253 and the first optical function layer 251 regardless of the shape of the surface of the first optical function layer 251. In the approach illustrated in FIG. 22, an optical interface may be formed by setting the refractive index of the low refractive layer 253 to be lower than the refractive index of the first optical function layer 251, and as a result, the change of an optical path such as refraction can be performed. The optical interface may also be formed in a similar manner between the low refractive layer 253 and the second optical function layer 255.

The second optical function layer 255 is illustrated as being a prism pattern layer, but various other optical function layers such as a micro-lens layer may be used as the second optical function layer 255. Also, the prism patterns of the first optical function layer 251 are illustrated as extending in parallel to the prism patterns of the second optical function layer 255, but the prism patterns of the first optical function layer 251 may intersect the prism patterns of the second optical function layer 255 at a right angle or at another angle.

The lower chassis 800 is disposed below the light guide plate 500. The lower chassis 800 accommodates the light guide plate 500 and the light source member 400 therein. For example, the lower chassis 800 may include a bottom portion 810 and first, second, third, and fourth sidewalls 831 (FIG. 2), 833 (FIG. 2), 835 (FIG. 5), and 837 (FIG. 5) extending upwardly from the bottom portion 810, and the light guide plate 500 and the light source member 400 may be disposed in a space defined by the bottom portion 810 and the first, second, third, and fourth sidewalls 831, 833, 835, and 837.

In one exemplary embodiment of the present disclosure, the bottom portion 810 may be in the form of a flat plate and may support the light guide plate 500 disposed thereon.

The first sidewall 831 may extend upwardly from the bottom portion 810 and may face the first side surface S1 of the light guide plate 500. The light source member 400 may be disposed on the first sidewall 831 to face the first side surface S1 of the light guide plate 500.

The second sidewall 833 may extend upwardly from the bottom portion 810 and may face the second side surface S2 of the light guide plate 500. Similarly, the third sidewall 835 may extend upwardly from the bottom portion 810 and may face the third side surface S3 of the light guide plate 500, and the fourth sidewall 837 may extend upwardly from the bottom portion 810 and may face the fourth side surface S4 of the light guide plate 500.

In some exemplary embodiments of the present disclosure, each pair of adjacent sidewalls of the lower chassis 800 may be connected. For example, the first and fourth sidewalls 831 and 837 may be connected, the first and third sidewalls 831 and 835 may be connected, the second and fourth sidewalls 833 and 837 may be connected, and the second and third sidewalls 833 and 835 may be connected.

The bottom portion 810 and the first, second, third, and fourth sidewalls 831, 833, 835, and 837 may define a space in which the light guide plate 500, the light source member 400, the wavelength conversion layer 210, the passivation layer 230, and the optical function layer 250 are accommodated.

As used herein, the term "inner side" or "inwardly" denotes a direction facing the space where the light guide plate 500 is disposed, and the term "outer side" or "outwardly" denotes a direction opposite to the direction corresponding to the term "inner side" or "inwardly".

The lower chassis 800 may further include first, second, third, and fourth extension portions 851 (FIG. 2), 853 (FIG. 2), 855 (FIG. 5), and 857 (FIG. 5).

The first, second, third, and fourth extension portions 851, 853, 855, and 857 are portions supporting the display panel structure 100 and coupling the display panel structure 100 and the housing 900. The first extension portion 851 may extend outwardly from the second sidewall 833 along the first direction DR1 and may overlap with the display panel structure 100. The third extension portion 855 may extend outwardly from the third sidewall 835, substantially in parallel to the second direction DR2, and may overlap with the display panel structure 100. The fourth extension portion 857 may extend outwardly from the fourth sidewall 837, substantially in parallel to the second direction DR2, and may overlap with the display panel structure 100.

The second extension portion 853 may extend inwardly from the first sidewall 831 along the first direction DR1 and may overlap with the light source member 400. In some exemplary embodiments of the present disclosure, the second extension portion 853 may overlap with the light source 410, and as a result, light leakage can be prevented from occurring in the non-display area NDA. In some exemplary embodiments of the present disclosure, the second extension portion 853 not only covers the light source 410, but also covers the space between the light source 410 and the incident surface of the light guide plate 500, e.g., the first side surface S1, and as a result, light leakage can be effectively prevented from occurring in the non-display area NDA. The second extension portion 853 is illustrated as overlapping with the light source 410, but not overlapping with the light guide plate 500, but the present disclosure is not limited thereto. For example, the second extension portion 853 may overlap not only with the light source 410 and the space between the light source 410 and the first side surface S1, but also with part of the light guide plate 500.

The lower chassis 800 may be formed of a rigid metal material such as stainless steel or a material that conducts heat such as aluminum (Al) or an Al alloy. In some exemplary embodiments of the present disclosure, the lower chassis 800 may have a thickness of 0.3 mm or less.

The lower chassis 800 and the display panel structure 100 may be coupled via panel coupling members.

For example, the first panel coupling member 311 is disposed between the first extension portion 851 of the lower chassis 800 and the display panel structure 100. The first panel coupling member 311 is placed in contact with the top surface of the first extension portion 851 and the bottom surface of the display panel structure 100 and couples the display panel structure 100 and the lower chassis 800.

In some exemplary embodiments of the present disclosure, the first panel coupling member 311 may comprise a light-absorbing material such as a black pigment or dye and may block the occurrence of light leakage between the lower chassis 800 and the display panel structure 100.

In some exemplary embodiments of the present disclosure, the first panel coupling member 311 may be provided as a double-sided adhesive tape, and the double-sided adhesive tape may be a foam tape in which the light-absorbing material and a resin are mixed. In a case where the first panel coupling member 311 is provided as the foam tape, the first panel coupling member 311 can perform a buffer function and can thus effectively protect the display device 1 against external shock. An acrylic resin such as polymethyl methacrylate (PMMA) or polyethyl methacrylate, a polyester resin such as polyethylene terephthalate (PET), polyethylene isophthalate, polyethylene naphthalate (PEN), or polybutylene terephthalate, a cellulose-based resin such as diacetyl cellulose or triacetyl cellulose, polyethylene, polypropylene, a polyolefin-based resin having a cyclo-based or norbornene structure, or a polyolefin-based resin such as an ethylene-propylene copolymer may be used as the resin of the foam tape, but the present disclosure is not limited thereto. In some exemplary embodiments of the present disclosure, polypropylene (PP) may be used as the resin of the foam tape. Since PP has a high permanent compression ratio (e.g., the rate of remaining compressed, instead of returning to its original state, after being compressed), PP can prevent the display panel structure 100 and the lower chassis 800 from being lifted off of each other by a repulsive force.

A second panel coupling member 313 may be disposed between the second extension portion 853 of the lower chassis 800 and the display panel structure 100. The second panel coupling member 313 is placed in contact with the top surface of the second extension portion 853 and the bottom surface of the display panel structure 100 and couples the display panel structure 100 and the lower chassis 800.

Also, a third panel coupling member 315 may be disposed between the third extension portion 855 of the lower chassis 800 and the display panel structure 100 and may be placed in contact with the top surface of the third extension portion 855 and the bottom surface of the display panel structure 100. Also, a fourth panel coupling member 317 may be disposed between the fourth extension portion 857 of the lower chassis 800 and the display panel structure 100 and may be placed in contact with the top surface of the fourth extension portion 857 and the bottom surface of the display panel structure 100.

The second, third, and fourth panel coupling members 313, 315, and 317 may comprise the same material as the first panel coupling member 311 or may comprise at least one of the above-mentioned exemplary materials of the first panel coupling member 311.

Various reflective members and buffer members may be disposed between the light guide plate 500 and the lower chassis 800.

For example, the first reflective member 611 may be disposed between the counter surface of the light guide plate 500, e.g., the second side surface S2, and the second sidewall 833 of the lower chassis 800, which faces the second side surface S2, and a first buffer member 631 may be disposed between the first reflective member 611 and the second sidewall 833.

Light leakage is likely to occur at the second side surface S2, which is the counter surface of the light guide plate 500, and the second sidewall 833 of the lower chassis 800, which faces the second side surface S2. The first reflective member 611 prevents light from being emitted toward the second side surface S2, which is the counter surface of the light guide plate 500, and thus prevents the occurrence of light leakage at the second side surface S2. Also, the first reflective member 611 reflects light emitted through the second side surface S2 so the light re-enters the light guide plate 500. As a result, the optical efficiency of the display device 1 can be increased.

In one exemplary embodiment of the present disclosure, the first reflective member 611 may be coupled to the second side surface S2 of the light guide plate 500 and may thus be placed in contact with the second side surface S2. The first reflective member 611 may be provided as a reflective film or a reflective tape and may be attached on the second side surface S2. Alternatively, the first reflective member 611 may be provided on the second side surface S2 as a coating, e.g., as a reflective coating layer.

The first reflective member 611 may comprise a light-reflecting material having a high reflectance. The light-reflecting material may be a reflective metal such as silver (Ag), aluminum (Al), or an alloy thereof or may be a highly reflective white resin.

There may be a gap between the light guide plate 500 and the second sidewall 833, and there may be a possibility that the light guide plate 500 is moved by external factors. As a result, an impact may occur between the light guide plate 500 and the second sidewall 833. In this case, the light guide plate 500 may be damaged, and the possibility of the light guide plate 500 being damaged may become higher, especially when the light guide plate 500 is formed of an inorganic material such as glass. Since the first buffer member 631 is disposed between the first reflective member 611 and the second sidewall 833 to relieve the impact that may occur between the light guide plate 500 and the second sidewall 833, the reliability and the durability of the display device 1 can be increased.

In one exemplary embodiment of the present disclosure, the first buffer member 631 may be coupled to, and placed in contact with, the first reflective member 611 and might not be placed in contact with the second sidewall 833. The first buffer member 631 may be relatively flexible, for example, it may be able to bend without breaking. In one exemplary embodiment of the present disclosure, the first buffer member 631 may be provided as a foam tape and may be attached on the first reflective member 611. In a case where the first buffer member 631 is provided as a foam tape, the first buffer member 631 may comprise the same material as the first panel coupling member 311 or may comprise at least one of the above-mentioned exemplary materials of the first panel coupling member 311. Alternatively, the first buffer member 631 may comprise an elastic material such as, for example, rubber, a silicone resin, or a polymer resin and may be coupled directly to the first reflective member 611. Alternatively, the first buffer member 631 may further include an adhesive layer and may be attached to the first reflective member 611.

A second reflective member 613 may be disposed between the third side surface S3 of the light guide plate 500 and the third sidewall 835 of the lower chassis 800, and a second buffer member 633 may be disposed between the second reflective member 613 and the third sidewall 835. Also, a third reflective member 615 may be disposed between the fourth side surface S4 of the light guide plate 500 and the fourth sidewall 837 of the lower chassis 800, and a third buffer member 635 may be disposed between the third reflective member 615 and the fourth sidewall 837.

The second reflective member 613 may be coupled to the third side surface S3 of the light guide plate 500 and may thus be placed in contact with the third side surface S3. The third reflective member 615 may be coupled to the fourth side surface S4 of the light guide plate 500 and may thus be placed in contact with the fourth side surface S4. The material and the type of the second and third reflective members 613 and 615 are substantially the same as, or similar to, the material and the type of the first reflective member 611, and thus, where subsequent detailed descriptions thereof is omitted, the omitted details may be understood to be at least similar to the previously described reflective members.

In some exemplary embodiments of the present disclosure, as illustrated in FIG. 6, one end of the first reflective member 611 may be connected to the second reflective member 613, and the other end of the first reflective member 611 may be connected to the third reflective member 615. Alternatively, at least one of the first, second, and third reflective members 611, 613, and 615 might not be connected to the other reflective member(s).

The second buffer member 633 may be coupled to, and placed in contact with, the second reflective member 613, and might not be placed in contact with the third sidewall 835. The third buffer member 635 may be coupled to, and placed in contact with, the third reflective member 615, and might not be placed in contact with the fourth sidewall 837. The material and the type of the second and third buffer members 633 and 635 are substantially the same as, or similar to, the material and the type of the first buffer member 631, and thus, to the extent that subsequent descriptions thereof are omitted, it may be assumed that they are at least similar to the buffer members already described.

In some exemplary embodiments of the present disclosure, as illustrated in FIG. 6, the first buffer member 631 may continue to extend along the second direction DR2, and the second and third buffer members 633 and 635 may continue to extend along the first direction DR1.

Alternatively, as illustrated in FIG. 7, the first buffer member 631 may include a plurality of sub-buffer members 631*a*, which are arranged along the second direction DR2. The second buffer member 633 may include a plurality of sub-buffer members 633*a*, which are arranged along the first direction DR1. The third buffer member 635 may include a plurality of sub-buffer members 635*a*, which are arranged along the first direction DR1.

The first, second, and third reflective members 611, 613, and 615 and the first, second, and third buffer members 631, 633, and 635 are illustrated as being disposed on the second, third, and fourth side surfaces S2, S3, and S4 of the light guide plate 500, respectively, but the present disclosure is not limited thereto. Alternatively, a reflective member and a buffer member may be disposed on only one of the second, third, and fourth side surfaces S2, S3, and S4. Alternatively, reflective members and buffer members may be disposed on only two of the second, third, and fourth side surfaces S2, S3, and S4.

The display device 1 may further include the reflective layer 700, which is disposed between the light guide plate 500 and the bottom portion 810 of the lower chassis 800. The reflective layer 700 may include a reflective film or a reflective coating layer. The reflective layer 700 reflects light emitted from the bottom surface of the light guide plate 500 so the light re-enters the light guide plate 500.

The display device 1 may further include the housing 900. The housing 900 may be disposed below the lower chassis 800 and may accommodate the lower chassis 800 and the elements disposed in the lower chassis 800 therein. In some exemplary embodiments of the present disclosure, the housing 900 may form the exterior of the display device 1.

The housing 900 may include a housing bottom portion 910 and first, second, third, and fourth housing sidewalls 931, 933, 935, and 937.

The housing bottom portion 910 may support the lower chassis 800 disposed thereabove. The housing bottom portion 910 may serve as a rear cover for the display device 1. For example, the housing bottom portion 910 may be a rear cover for a product such as a television (TV), a notebook computer, or a monitor. The housing bottom portion 910 is illustrated as being in the form of a flat plate, however, the housing bottom portion 910 may have other shapes. For example, the housing bottom portion 910 may have various shapes other than that set forth herein, for example, a shape having curvature such as an at least partially rounded shape.

The first, second, third, and fourth housing sidewalls 931, 933, 935, and 937 extend upwardly from the housing bottom portion 910. The first housing sidewall 931 may face the outer side of the first sidewall 831 of the lower chassis 800. The second housing sidewall 933 may face the outer side of the second sidewall 833 of the lower chassis 800 and may overlap with the first extension portion 851 of the lower chassis 800. The third housing sidewall 935 may face the outer side of the second sidewall 835 of the lower chassis 800 and may overlap with the third extension portion 855 of the lower chassis 800. The fourth housing sidewall 937 may face the outer side of the fourth sidewall 837 of the lower chassis 800 and may overlap with the fourth extension portion 857 of the lower chassis 800.

The second housing sidewall 933 may extend upwardly from the housing bottom portion 910 and may face the second side surface S2 of the light guide plate 500. Similarly, the third housing sidewall 935 may extend upwardly from the housing bottom portion 910 and may face the third side surface S3 of the light guide plate 500. The fourth housing sidewall 937 may extend upwardly from the housing bottom portion 910 and may face the fourth side surface S4 of the light guide plate 500.

The first, second, third, and fourth housing sidewalls 931, 933, 935, and 937 may be exposed to the outside and may surround the sidewalls of the lower chassis 800 and may thus serve as a cover for the sides of the display device 1. For example, the first, second, third, and fourth housing sidewalls 931, 933, 935, and 937 may form a cover for the sides of a product such as a TV, a notebook computer, or a monitor.

The housing 900 and the lower chassis 800 may be coupled via housing coupling members.

For example, the first housing coupling member 331 is disposed between the first extension portion 851 of the lower chassis 800 and the second housing sidewall 933 of the housing 900. The first housing coupling member 331 is placed in contact with the bottom surface of the first extension portion 851 and the top surface of the second housing sidewall 933 and couples the housing 900 and the lower chassis 800.

A second housing coupling member 333 is disposed between the third extension portion 855 of the lower chassis 800 and the third housing sidewall 935 of the housing 900 and is placed in contact with the bottom surface of the third extension portion 855 and the top surface of the third housing sidewall 935, and a third housing coupling member 335 is disposed between the fourth extension portion 857 of the lower chassis 800 and the fourth housing sidewall 937 of the housing 900 and is placed in contact with the bottom surface of the fourth extension portion 857 and the top surface of the fourth housing sidewall 937.

In some exemplary embodiments of the present disclosure, the first, second, and third housing coupling members 331, 333, and 335 may be provided as adhesives or gluing agents. Alternatively, the first, second, and third housing coupling members 331, 333, and 335 may be provided as double-sided adhesive tapes. In a case where the first, second, and third housing coupling members 331, 333, and 335 are provided as double-sided tapes, the first, second, and third housing coupling members 331, 333, and 335 may comprise the same material as the first panel coupling member 311 or may comprise at least one of the above-mentioned exemplary materials of the first panel coupling member 311.

The display panel structure 100 might not be accommodated in the housing 900. For example, the display panel structure 100 might not be disposed in a space defined by the housing bottom portion 910 and the first, second, third, and fourth housing sidewalls 931, 933, 935, and 937.

The display panel structure 100 is not disposed in the housing 900 and is supported by the lower chassis 800. Thus, the front and the sides of the display panel structure 100 are exposed to the outside. Accordingly, a structure (such as a bezel) that forms the front edges of the display panel structure 100 can be minimized or removed. Therefore, a display device 1 can be provided with no bezel, and as a result, the display device 1 can be more aesthetically pleasing.

The housing 900 may overlap with the display panel structure 100. In some exemplary embodiments of the present disclosure, the housing 900 may completely overlap with the display panel structure 100. For example, in a plan view, the housing 900, particularly, the first, second, third, and fourth housing sidewalls 931, 933, 935, and 937, may be completely hidden from view by the display panel structure 100. Accordingly, the housing 900 may be invisible from above the display device 1, and as a result, the display device 1 can be made more aesthetically pleasing.

Figure 8:
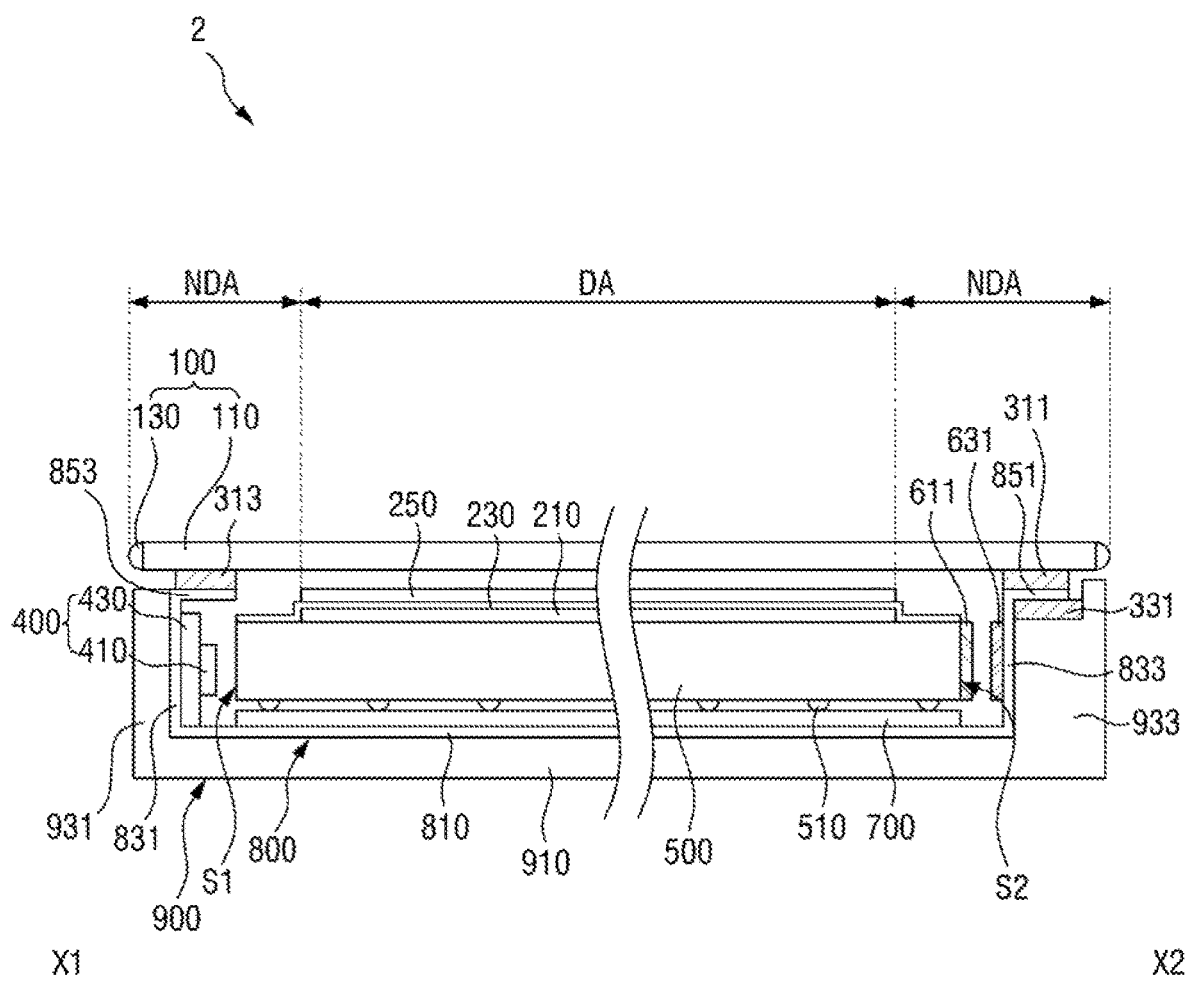
FIG. 8 is a cross-sectional view, taken along line X1-X2 of FIG. 1, of a display device according to an exemplary embodiment of the present disclosure.
Figure 9:
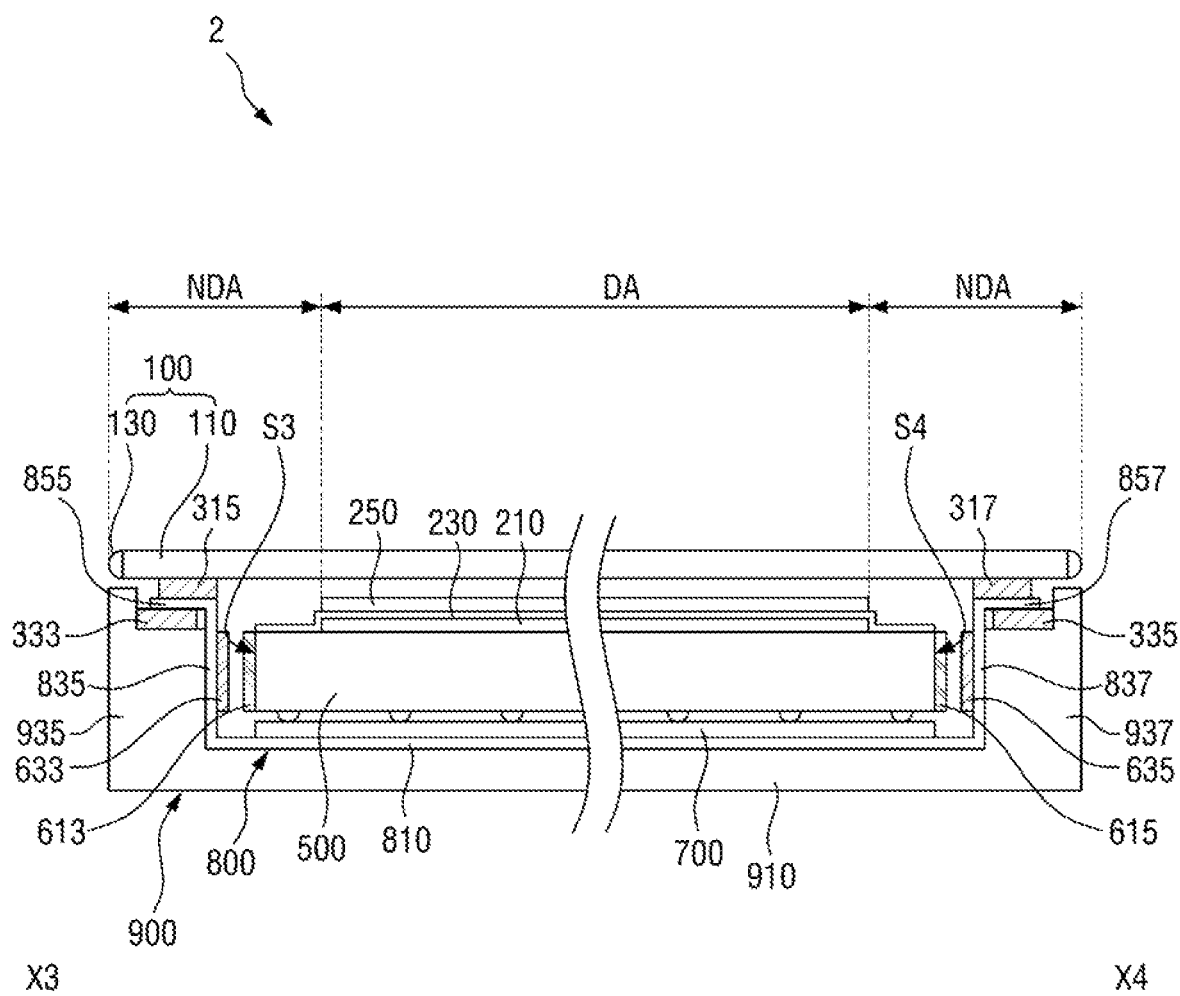
FIG. 9 is a cross-sectional view, taken along line X3-X4 of FIG. 1, of the display device of FIG. 8.
Figure 10:
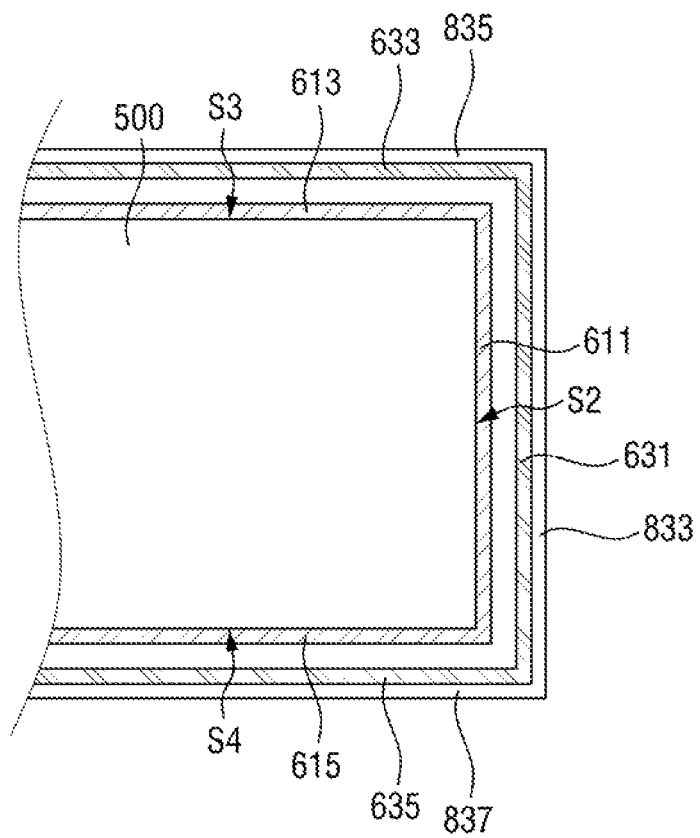
FIG. 10 is a plan view illustrating an arrangement of a light guide plate, the sidewalls of a lower chassis, reflective members, and buffer members in the display device of FIGS. 8 and 9.
Figure 10:
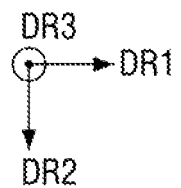
Figure 11:
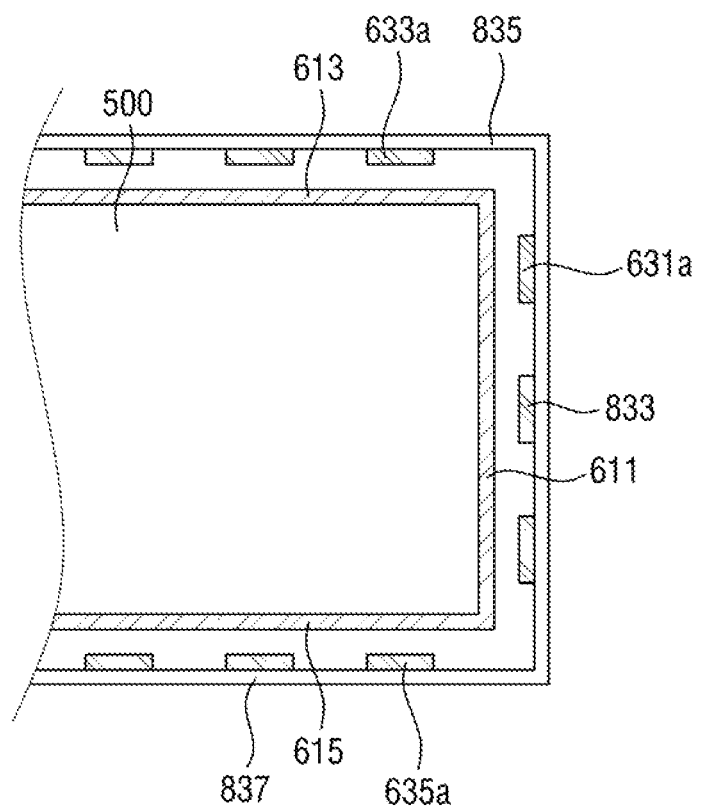
FIG. 11 is a plan view illustrating a modified example of FIG. 10.
Figure 11:
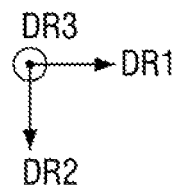

FIG. 8 is a cross-sectional view, taken along line X1-X2 of FIG. 1, of a display device according to an exemplary embodiment of the present disclosure. FIG. 9 is a cross-sectional view, taken along line X3-X4 of FIG. 1, of the display device of FIG. 8. FIG. 10 is a plan view illustrating the arrangement of a light guide plate, the sidewalls of a lower chassis, reflective members, and buffer members in the display device of FIGS. 8 and 9. FIG. 11 is a plan view illustrating a modified example of FIG. 10.

Referring to FIGS. 8 through 11, a display device 2 is substantially the same as the display device 1 of FIGS. 1 through 7 except for the locations of first, second, and third buffer members 631, 633, and 635. Thus, the display device 2 will hereinafter be described, focusing mainly on the differences with the display device 1 of FIGS. 1 through 7. Omitted details may therefore be assumed to be at least similar to those described above.

The first buffer member 631 may be coupled to, and placed in contact with, a second sidewall 833 and might not be placed in contact with, but may be spaced apart from, a first reflective member 611. For example, the first reflective member 611 may be spaced apart from the first buffer member 631.

Similarly, the second buffer member 633 may be coupled to, and placed in contact with, a third sidewall 835 and might not be placed in contact with, but may be spaced apart from, a second reflective member 613. Similarly, the third buffer member 635 may be coupled to, and placed in contact with, a fourth sidewall 837 and might not be placed in contact with, but may be spaced apart from, a third reflective member 615.

As illustrated in FIG. 10, the first buffer member 631 may continue to extend along a second direction DR2, and the second and third buffer members 633 and 635 may continue to extend along a first direction DR1.

Alternatively, as illustrated in FIG. 11, the first buffer member 631 may include a plurality of sub-buffer members 631a, which are arranged along the second direction DR2. The second buffer member 633 may include a plurality of sub-buffer members 633a, which are arranged along the first direction DR1. The third buffer member 635 may include a plurality of sub-buffer members 635a, which are arranged along the first direction DR1.

Figure 12:
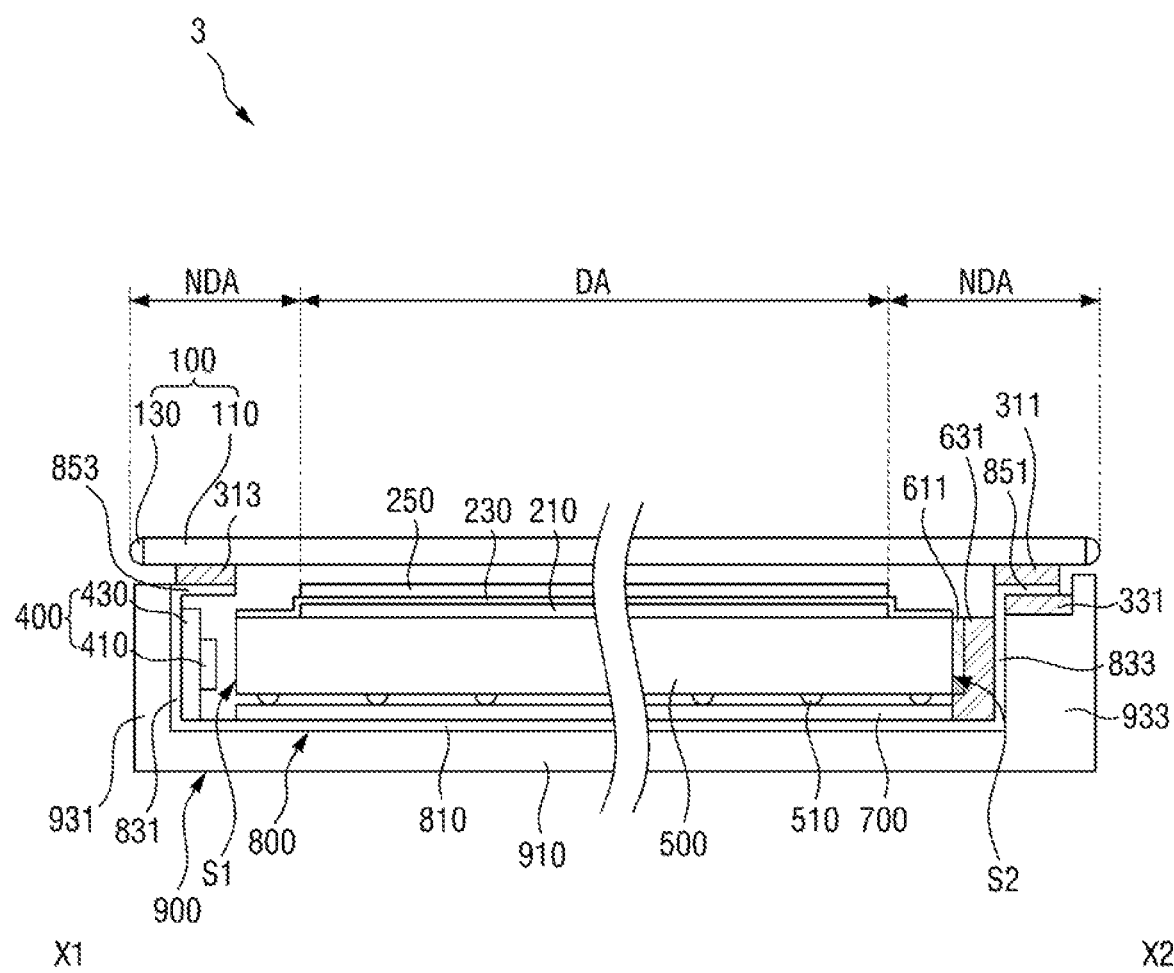
FIG. 12 is a cross-sectional view, taken along line X1-X2 of FIG. 1, of a display device according to an exemplary embodiment of the present disclosure.
Figure 13:
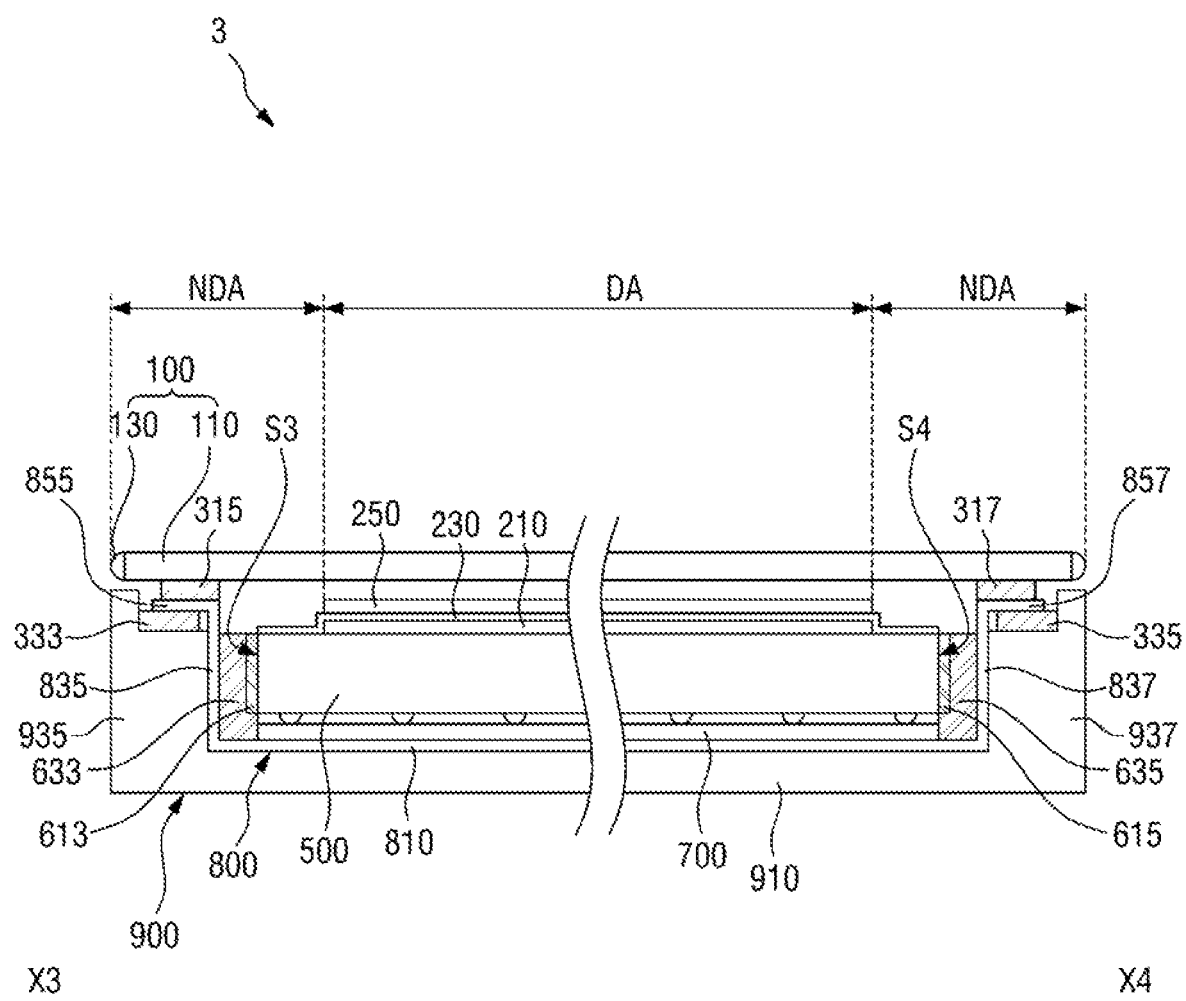
FIG. 13 is a cross-sectional view, taken along line X3-X4 of FIG. 1, of the display device of FIG. 12.
Figure 14:
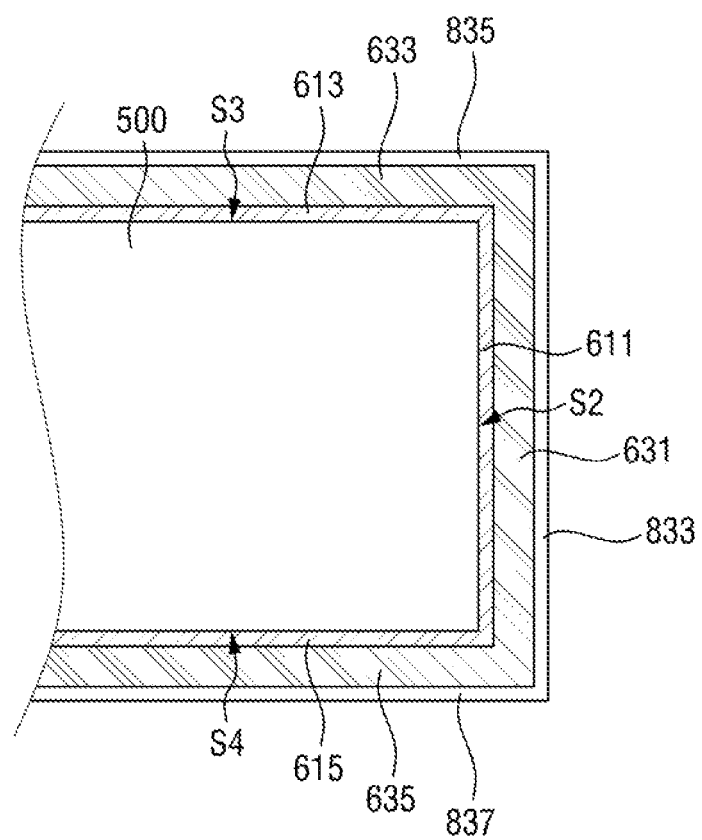
FIG. 14 is a plan view illustrating the arrangement of a light guide plate, the sidewalls of a lower chassis, reflective members, and buffer members in the display device of FIGS. 12 and 13.
Figure 14:
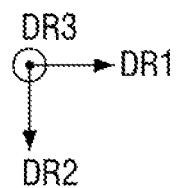
Figure 15:
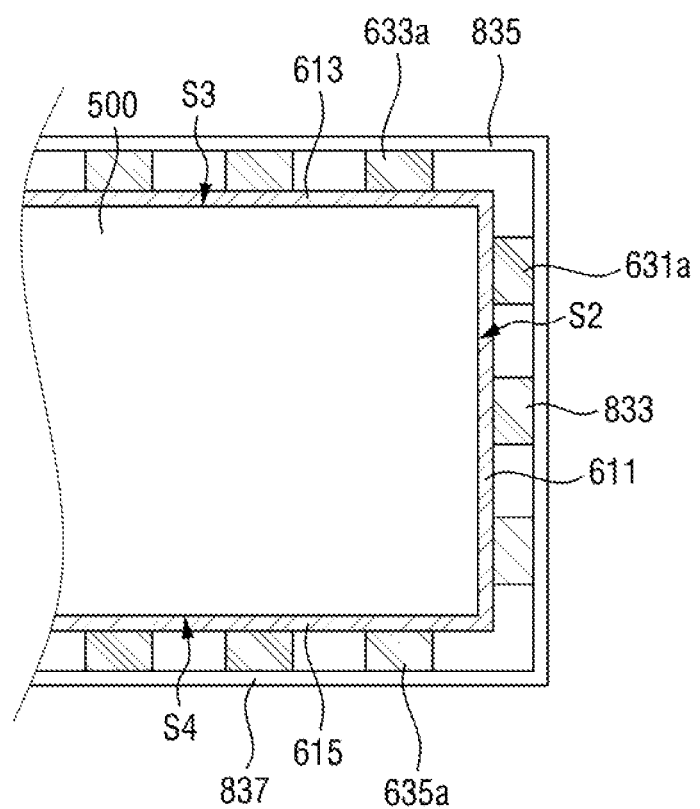
FIG. 15 is a plan view illustrating a modified example of FIG. 14.

FIG. 12 is a cross-sectional view, taken along line X1-X2 of FIG. 1, of a display device according to an exemplary embodiment of the present disclosure. FIG. 13 is a cross-sectional view, taken along line X3-X4 of FIG. 1, of the display device of FIG. 12. FIG. 14 is a plan view illustrating the arrangement of a light guide plate, the sidewalls of a lower chassis, reflective members, and buffer members in the display device of FIGS. 12 and 13. FIG. 15 is a plan view illustrating a modified example of FIG. 14.

Referring to FIGS. 12 through 15, a display device 3 is substantially the same as the display device 1 of FIGS. 1 through 7 except for the locations of first, second, and third buffer members 631, 633, and 635. Thus, the display device 3 will hereinafter be described, focusing mainly on the differences with the display device 1 of FIGS. 1 through 7. Omitted details may therefore be assumed to be at least similar to those described above.

The first buffer member 631 may be placed in contact with a first reflective member 611 and a second sidewall 833. In some exemplary embodiments of the present disclosure, as illustrated in FIG. 14, the first buffer member 631 may completely fill the space between the first reflective member 611 and the second sidewall 833.

Similarly, the second buffer member 633 may be placed in contact with a second reflective member 613 and a third sidewall 835. In some exemplary embodiments of the present disclosure, as illustrated in FIG. 14, the second buffer member 633 may completely fill the space between the second reflective member 613 and the third sidewall 835. Similarly, the third buffer member 635 may be placed in contact with a third reflective member 615 and a fourth sidewall 837. In some exemplary embodiments of the present disclosure, as illustrated in FIG. 14, the third buffer member 635 may completely fill the space between the third reflective member 615 and the fourth sidewall 837.

Alternatively, as illustrated in FIG. 15, the first buffer member 631 may include a plurality of sub-buffer members 631a, which are arranged along a second direction DR2. Accordingly, the first reflective member 611 may be spaced apart from the second sidewall 833. Also, as illustrated in FIG. 15, the second buffer member 633 may include a plurality of sub-buffer members 633a, which are arranged along a first direction DR1. The third buffer member 635 may include a plurality of sub-buffer members 635a, which are arranged along the first direction DR1. Accordingly, the second reflective member 613 may be spaced apart from the third sidewall 835 and the third reflective member 615 may be spaced apart from the fourth sidewall 837.

Since the first, second, and third buffer members 631, 633, and 635 can fill the spaces between the second, third, and fourth sidewalls 833, 835, and 837 of the lower chassis 800 and the light guide plate 500, the movement of the light guide plate 500 can be prevented.

Figure 16:
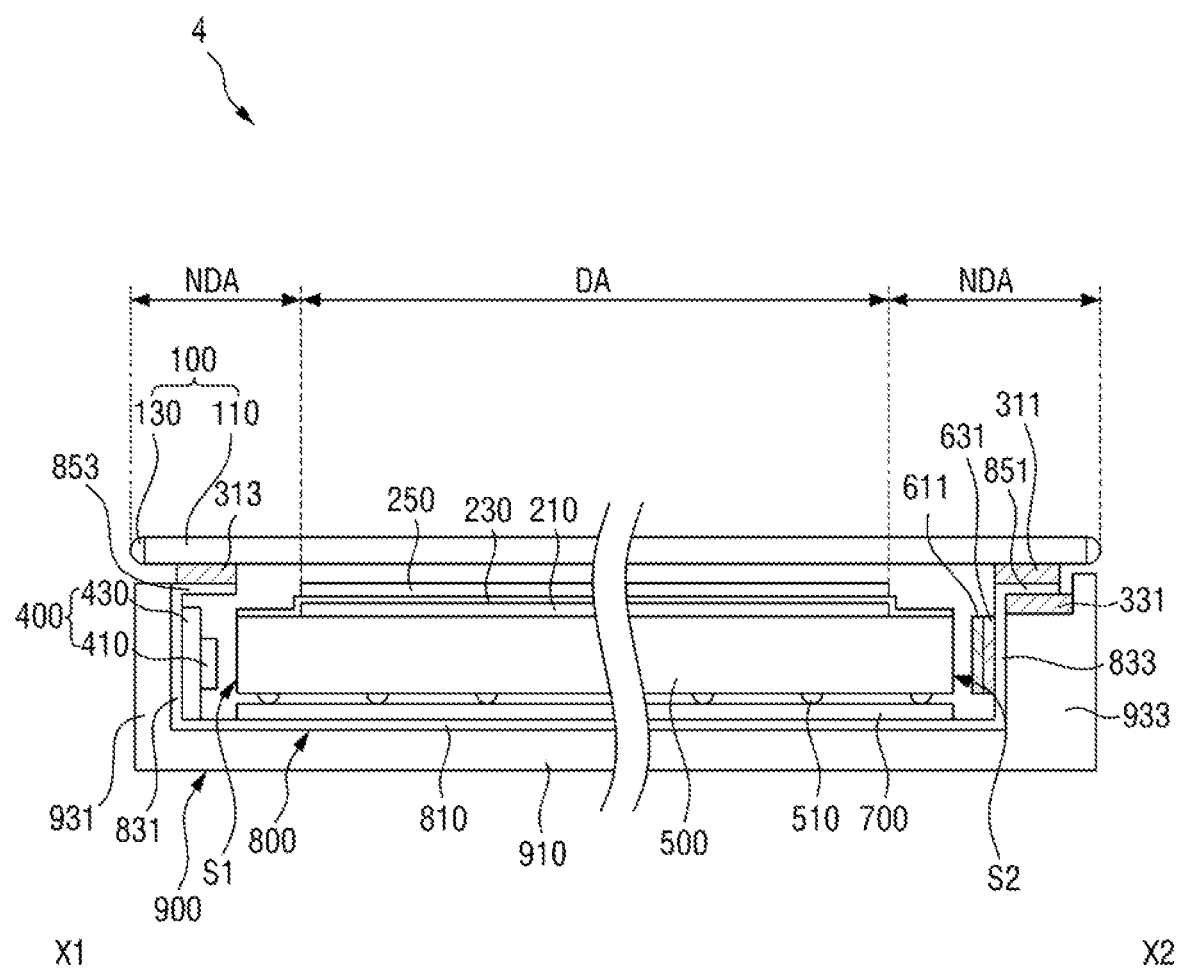
FIG. 16 is a cross-sectional view, taken along line X1-X2 of FIG. 1, of a display device according to an exemplary embodiment of the present disclosure.
Figure 17:
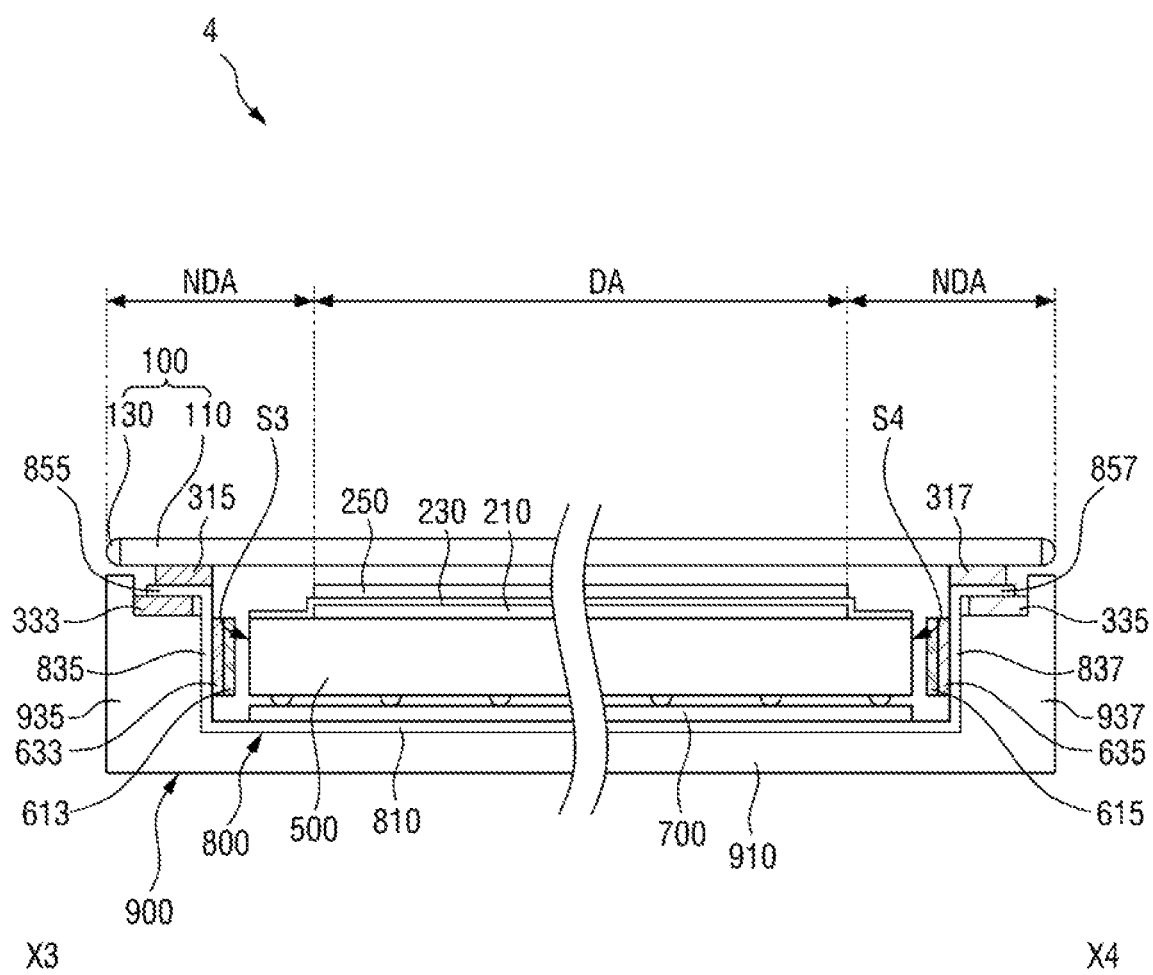
FIG. 17 is a cross-sectional view, taken along line X3-X4 of FIG. 1, of the display device of FIG. 16.
Figure 18:
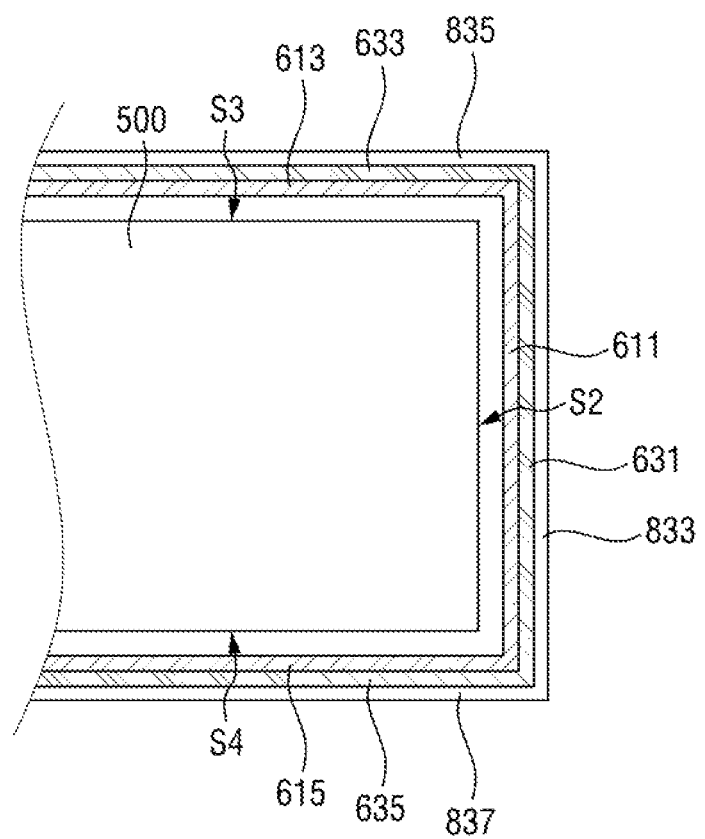
FIG. 18 is a plan view illustrating an arrangement of a light guide plate, the sidewalls of a lower chassis, reflective members, and buffer members in the display device of FIGS. 16 and 17.
Figure 18:
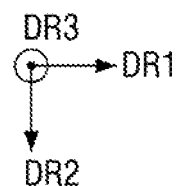
Figure 19:
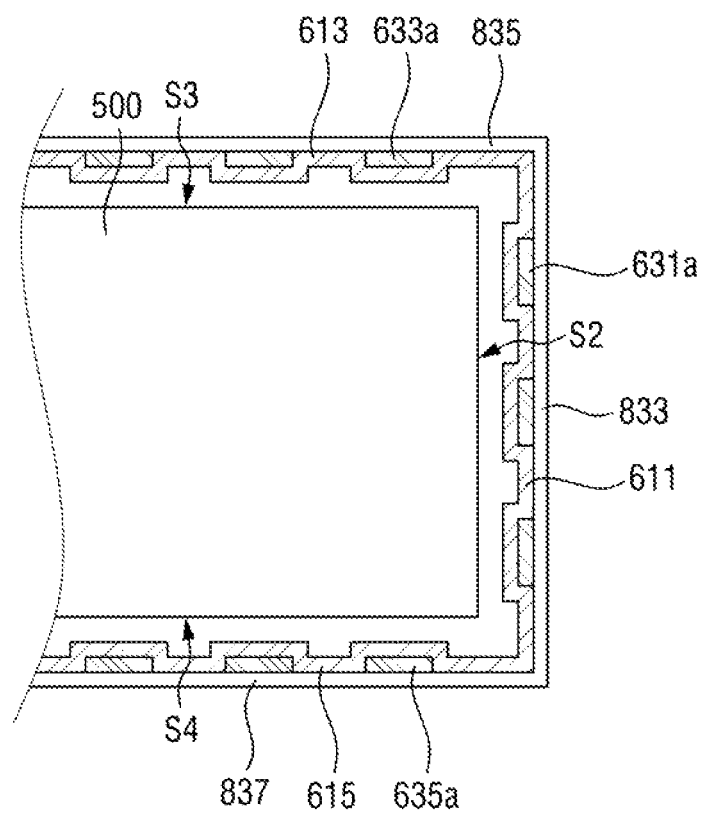
FIG. 19 is a plan view illustrating a modified example of FIG. 18.
Figure 19:
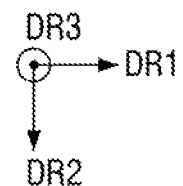

FIG. 16 is a cross-sectional view, taken along line X1-X2 of FIG. 1, of a display device according to an exemplary embodiment of the present disclosure. FIG. 17 is a cross-sectional view, taken along line X3-X4 of FIG. 1, of the display device of FIG. 16. FIG. 18 is a plan view illustrating the arrangement of a light guide plate, the sidewalls of a lower chassis, reflective members, and buffer members in the display device of FIGS. 16 and 17. FIG. 19 is a plan view illustrating a modified example of FIG. 18.

Referring to FIGS. 16 through 19, a display device 4 is substantially the same as the display device 2 of FIGS. 8 through 11 except for the locations of first, second, and third reflective members 611, 613, and 615. Thus, the display device 4 will hereinafter be described, focusing mainly on the differences with the display device 2 of FIGS. 8 through 11. Omitted details may therefore be assumed to be at least similar to those described above. 1s The first reflective member 611 may be coupled to, and placed in contact with, a first buffer member 631 and might not be placed in contact with, but may be spaced apart from, a second side surface S2 of a light guide plate 500. For example, the first reflective member 611 may be spaced apart from the second side surface S2.

Similarly, the second reflective member 613 may be coupled to, and placed in contact with, a second buffer member 633 and might not be placed in contact with, but may be spaced apart from, a third side surface S3 of the light guide plate 500. Similarly, the third reflective member 615 may be coupled to, and placed in contact with, a third buffer member 635 and might not be placed in contact with, but may be spaced apart from, a fourth side surface S4 of the light guide plate 500.

As illustrated in FIG. 18, the first buffer member 631 may continue to extend along a second direction DR2, and the second and third buffer members 633 and 635 may continue to extend along a first direction DR1. In this case, the first, second, and third reflective members 611, 613, and 615 might not be placed in contact with second, third, and fourth sidewalls 833, 835, and 837, respectively.

Alternatively, as illustrated in FIG. 19, the first buffer member 631 may include a plurality of sub-buffer members 631a, which are arranged along the second direction DR2, in which case, the first reflective member 611 may be partially placed in contact with the second sidewall 833. Also, as illustrated in FIG. 19, the second buffer member 633 may include a plurality of sub-buffer members 633a, which are arranged along the first direction DR1, in which case, the second reflective member 613 may be partially placed in contact with the third sidewall 835. Also, as illustrated in FIG. 19, the third buffer member 635 may include a plurality of sub-buffer members 635a, which are arranged along the first direction DR1, in which case, the third reflective member 615 may be partially placed in contact with the fourth sidewall 837.

Figure 20:
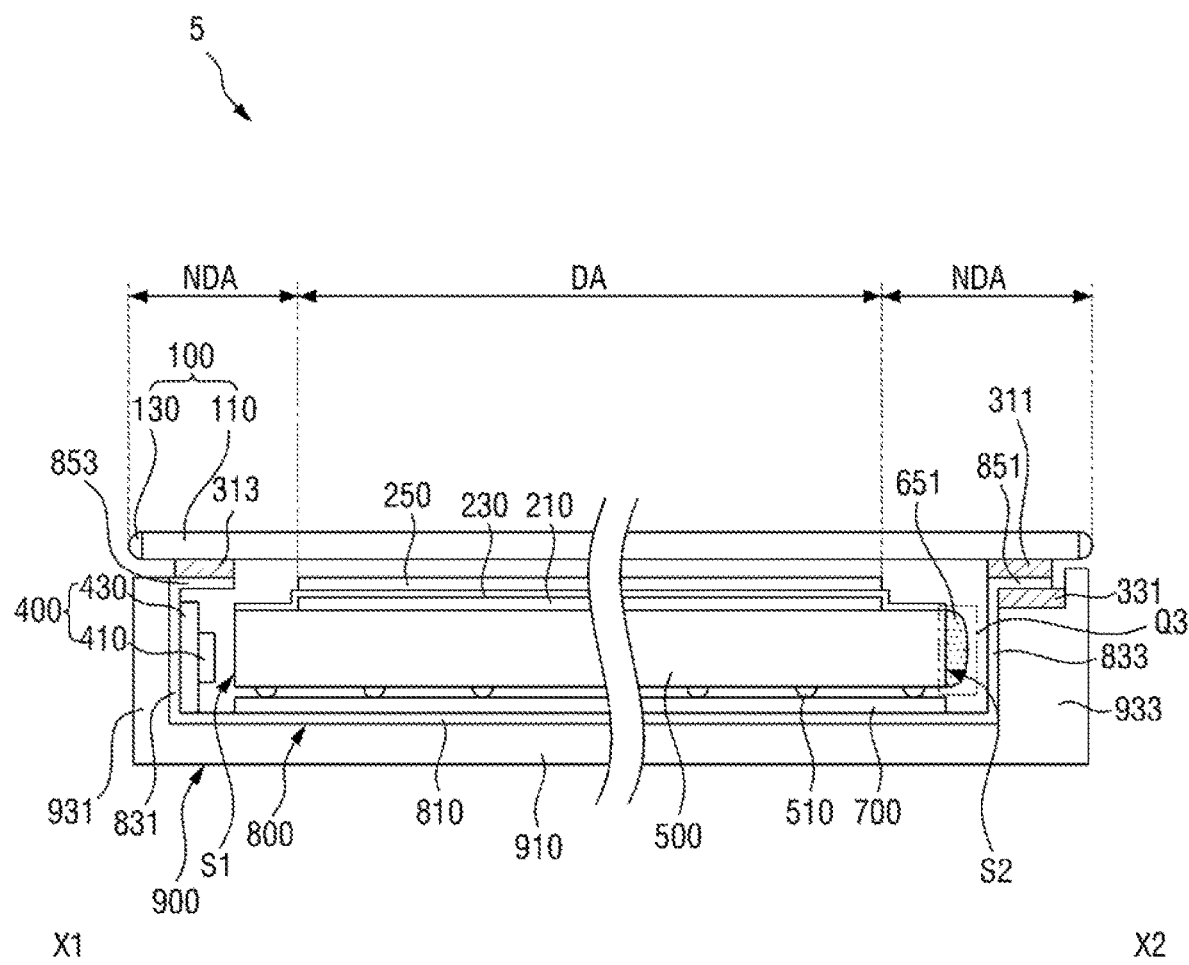
FIG. 20 is a cross-sectional view, taken along line X1-X2 of FIG. 1, of a display device according to an exemplary embodiment of the present disclosure.
Figure 21:
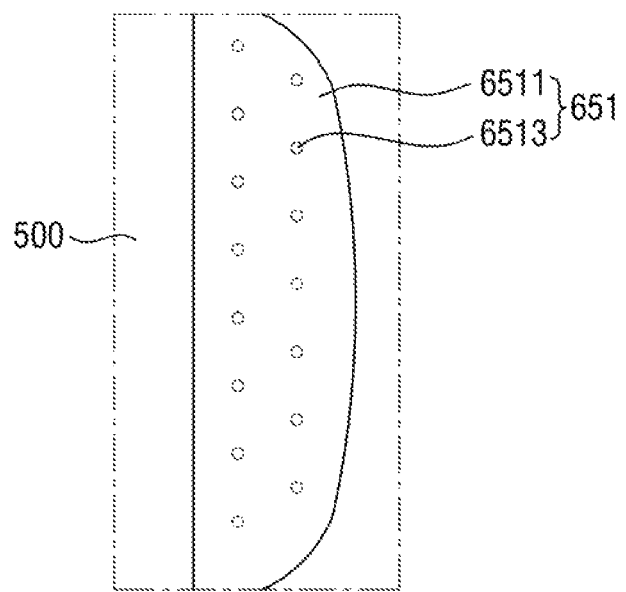
FIG. 21 is an enlarged cross-sectional view of an area Q3 of FIG. 20.
Figure 22:
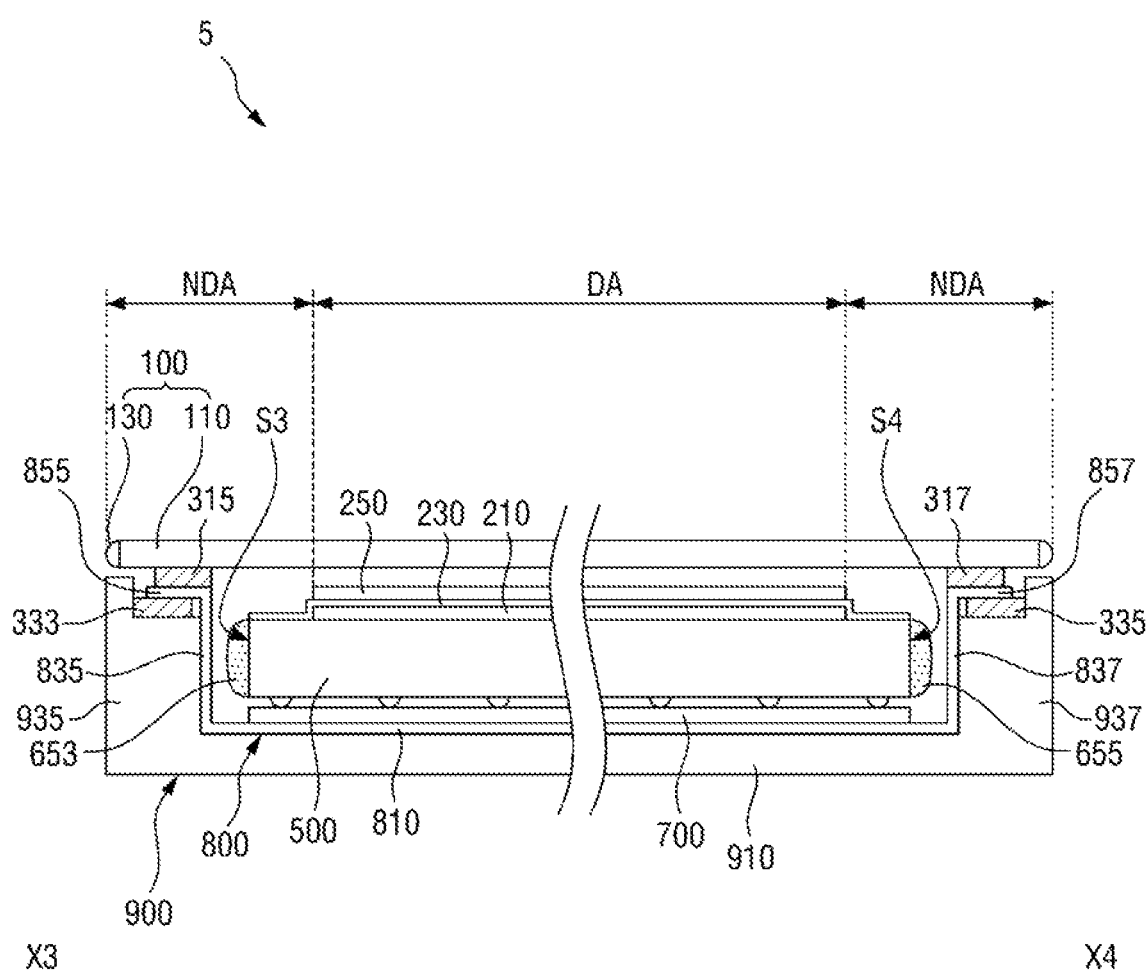
FIG. 22 is a cross-sectional view, taken along line X3-X4 of FIG. 1, of a display device according to an exemplary embodiment of the present disclosure.
Figure 23:
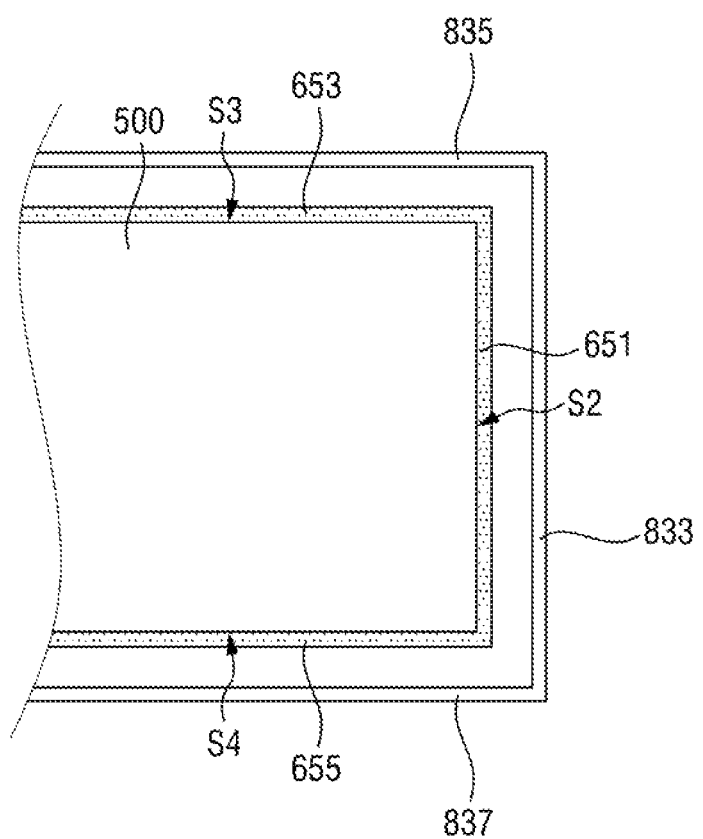
FIG. 23 is a plan view illustrating an arrangement of a light guide plate, the sidewalls of a lower chassis, reflective members, and buffer members in the display device of FIGS. 20 through 22.
Figure 23:
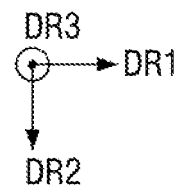
Figure 24:
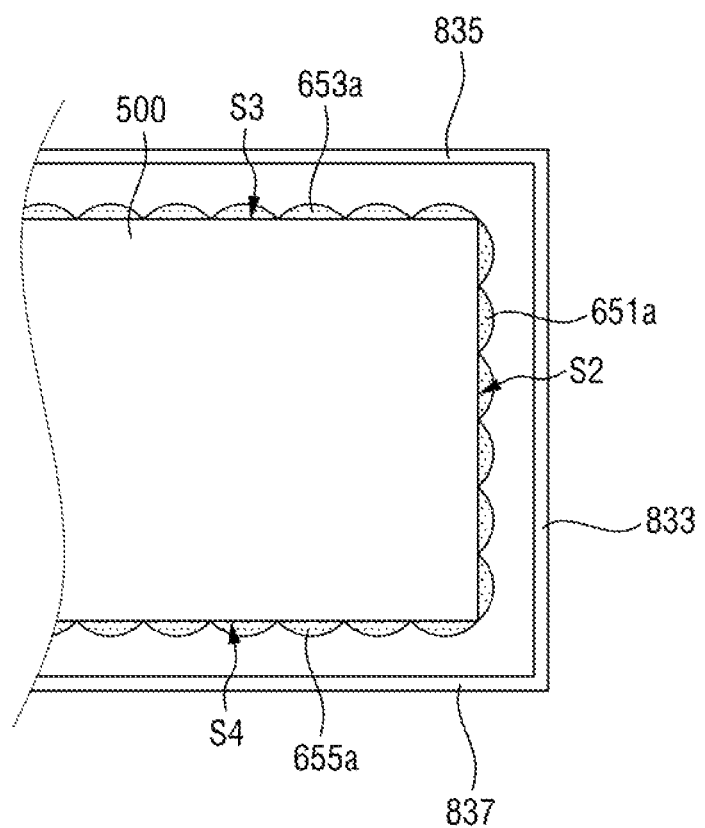
FIG. 24 is a plan view illustrating a modified example of FIG. 23.
Figure 24:
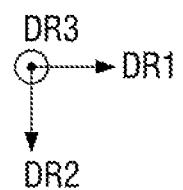

FIG. 20 is a cross-sectional view, taken along line X1-X2 of FIG. 1, of a display device according to an exemplary embodiment of the present disclosure. FIG. 21 is an enlarged cross-sectional view of an area Q3 of FIG. 20. FIG. 22 is a cross-sectional view, taken along line X3-X4 of FIG. 1, of a display device according to an exemplary embodiment of the present disclosure. FIG. 23 is a plan view illustrating the arrangement of a light guide plate, the sidewalls of a lower chassis, reflective members, and buffer members in the display device of FIGS. 20 through 22. FIG. 24 is a plan view illustrating a modified example of FIG. 23.

Referring to FIGS. 20 through 24, a display device 5 is substantially the same as the display device 1 of FIGS. 1 through 7 in that it includes first, second, and third buffer members 651, 653, and 655 having a reflection function, instead of the first, second, and third reflective members 611, 613, and 615 and the first, second, and third buffer members 631, 633, and 635 of FIGS. 1 through 7. Thus, the display device 5 will hereinafter be described, focusing mainly on the differences with the display device 1 of FIGS. 1 through 7. Omitted details may therefore be assumed to be at least similar to those described above.

The first, second, and third buffer members 631, 633, and 635, which reflect light, may be disposed between the side surfaces of a light guide plate 500 and the sidewalls of a lower chassis 800.

For example, the first buffer member 651 may be disposed between a counter surface of the light guide plate 500, e.g., a second side surface S2, and a second sidewall 833 of the lower chassis 800 that faces the second side surface S2.

The first buffer member 651 not only has a buffer function, but also has a reflection function. In one exemplary embodiment of the present disclosure, the first buffer member 651 may be coupled to, and placed in contact with, the second side surface S2 of the light guide plate 500. Also, the first buffer member 651 might not be placed in contact with, but may be spaced apart from, the second sidewall 833.

In one exemplary embodiment of the present disclosure, the first reflective member 611 may comprise an elastic and reflective white resin. Alternatively, the first reflective member 611 may include an elastic light-transmitting resin 6511 and reflective particles 6513 dispersed within the elastic light-transmitting resin 6511.

In some exemplary embodiments of the present disclosure, the light-transmitting resin 6511 may be a silicone resin or a polymer resin. In some exemplary embodiments of the present disclosure, the refractive index of the light-transmitting resin 6511 may be lower than the refractive index of the light guide plate 500, and as a result, the amount of light emitted from the second side surface S2 can be reduced.

The reflective particles 6513 may comprise a material having a high reflectance, e.g., a reflective metal such as Al, Ag, gold (Au), platinum (Pt), palladium (Pd), copper (Cu), titanium (Ti), or an alloy thereof. Alternatively, oxide particles, nitride particles, or ceramic particles may be used as the reflective particles 6513.

The second and third buffer members 653 and 655, like the first buffer member 651, may have a buffer function and a reflection function. The second buffer member 653 may be coupled to, and placed in contact with, a third side surface S3 of the light guide plate 500. The second buffer member 653 might not be placed in contact with, but may be spaced apart from, a third sidewall 835. The third buffer member 655 may be coupled to, and placed in contact with, a fourth side surface S4 of the light guide plate 500. The third buffer member 655 might not be placed in contact with, but may be spaced apart from, a fourth sidewall 837.

In some exemplary embodiments of the present disclosure, the first buffer member 651 may have a lens shape in a cross-sectional view. For example, the lens shape may be a convex lens shape, particularly, a semielliptical shape or a semicircular shape, but the present disclosure is not limited thereto and the first buffer member 651 may have various other shapes. In a case where the first buffer member 651 has a lens shape in a cross-sectional view, the amount of light reflected by the first buffer member 651 to re-enter the light guide plate 500 can be increased.

The material and the shape of the second and third buffer members 653 and 655 are substantially the same as, or similar to, the material and the shape of the first buffer member 651, and thus, detailed descriptions thereof will be omitted. Omitted details may therefore be assumed to be at least similar to those described above.

As illustrated in FIG. 23, the first buffer member 651 may continue to extend along a second direction DR2, and the second and third buffer members 653 and 655 may continue to extend along a first direction DR1.

Figure 25:
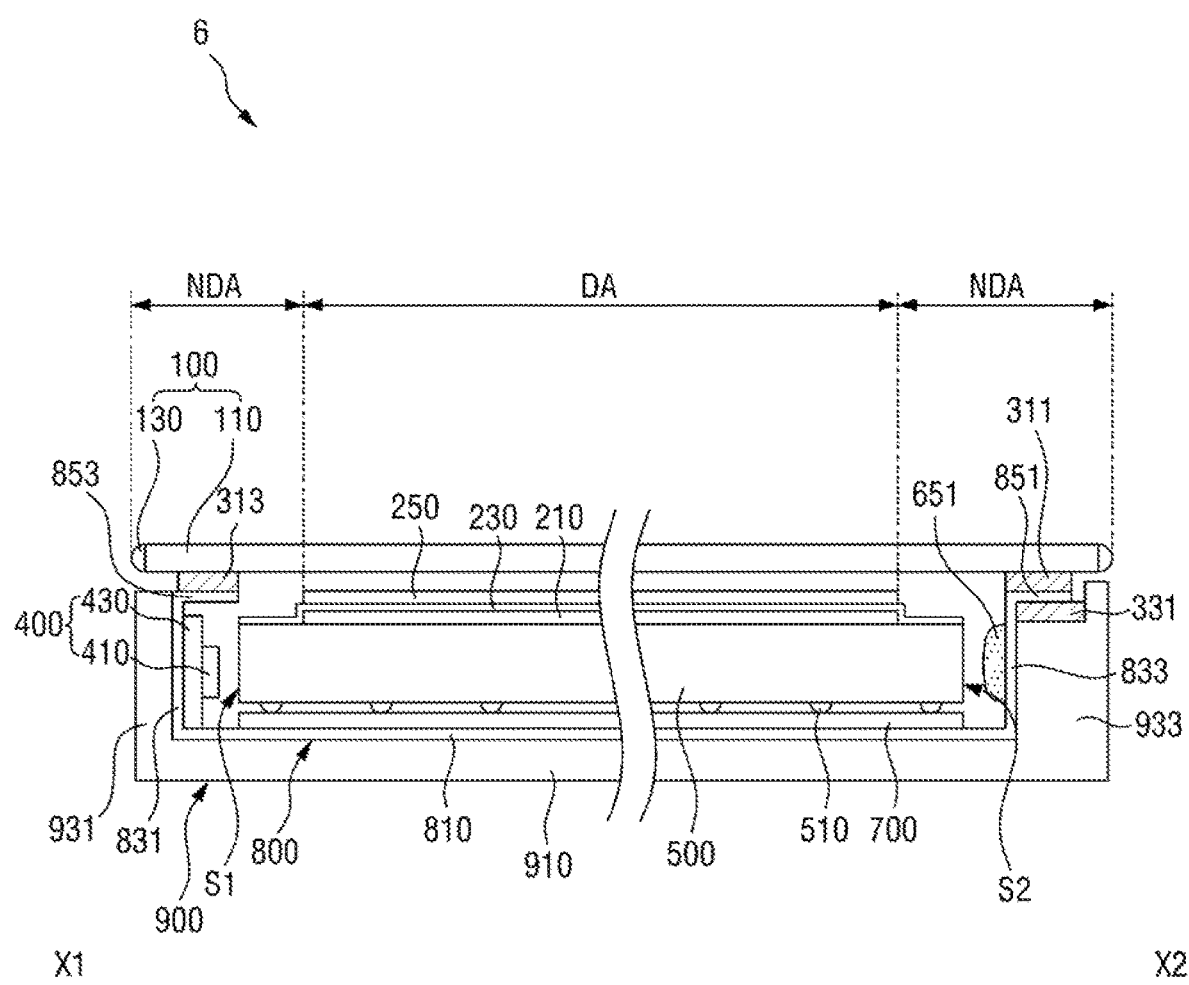
FIG. 25 is a cross-sectional view, taken along line X1-X2 of FIG. 1, of a display device according to an exemplary embodiment of the present disclosure.

Alternatively, as illustrated in FIG. 25, the first buffer member 651 may include a plurality of sub-buffer members 651a, which are arranged along the second direction DR2. In some exemplary embodiments of the present disclosure, the sub-buffer members 651a may have a lens shape in a plan view, and the lens shape may be a convex lens shape. In some exemplary embodiments of the present disclosure, the sub-buffer members 651a may be connected to one another along the second direction DR2 or may be isolated from one another.

Similarly, the second buffer member 653 may include a plurality of sub-buffer members 653a, which are arranged along the first direction DR1, and the third buffer member 655 may include a plurality of sub-buffer members 655a, which are arranged along the first direction DR1. The sub-buffer members 653a and the sub-buffer members 655a are substantially the same as, or similar to, the sub-buffer members 651a, and thus, detailed descriptions thereof will be omitted. Omitted details may therefore be assumed to be at least similar to those described above.

Figure 26:
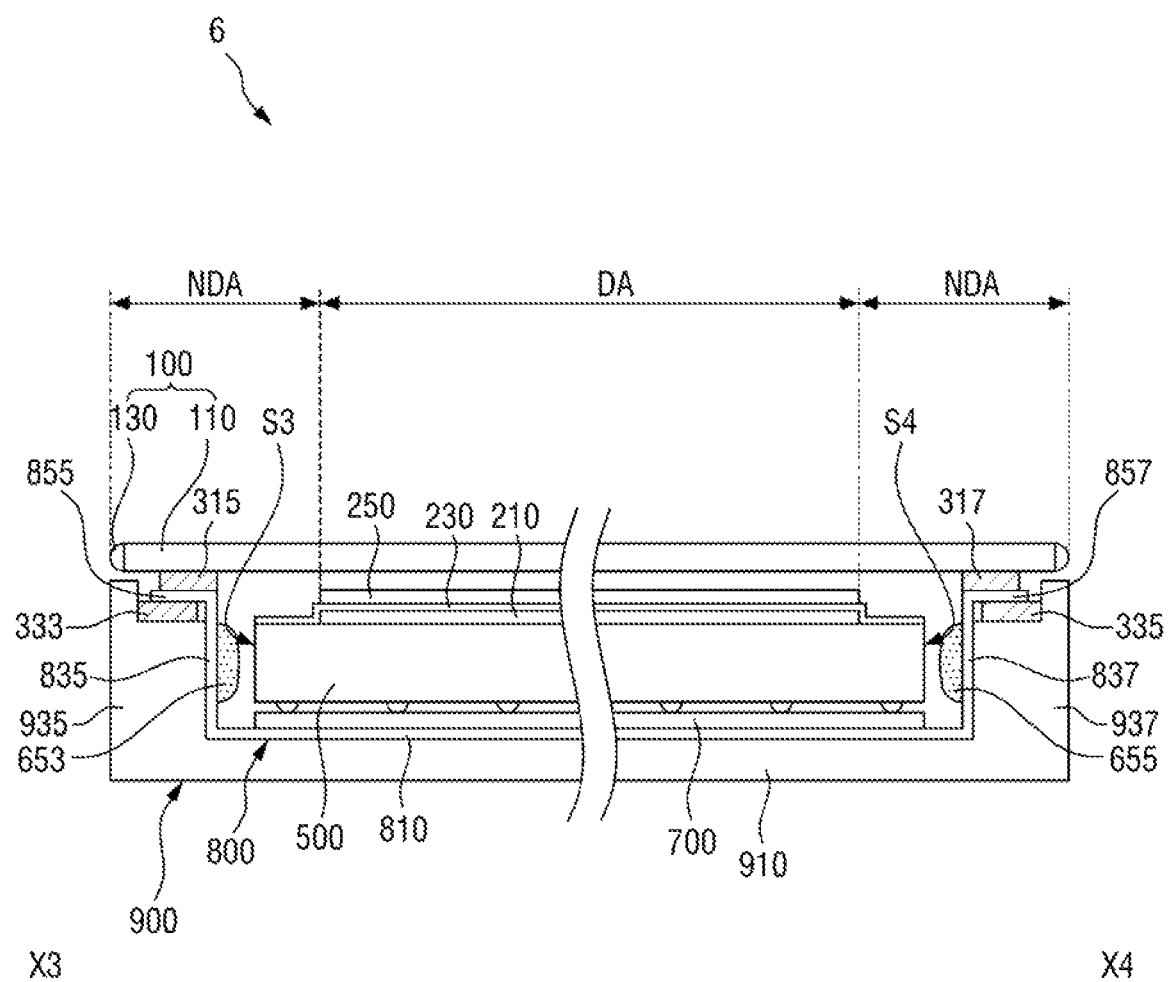
FIG. 26 is a cross-sectional view, taken along line X3-X4 of FIG. 1, of the display device of FIG. 25.
Figure 27:
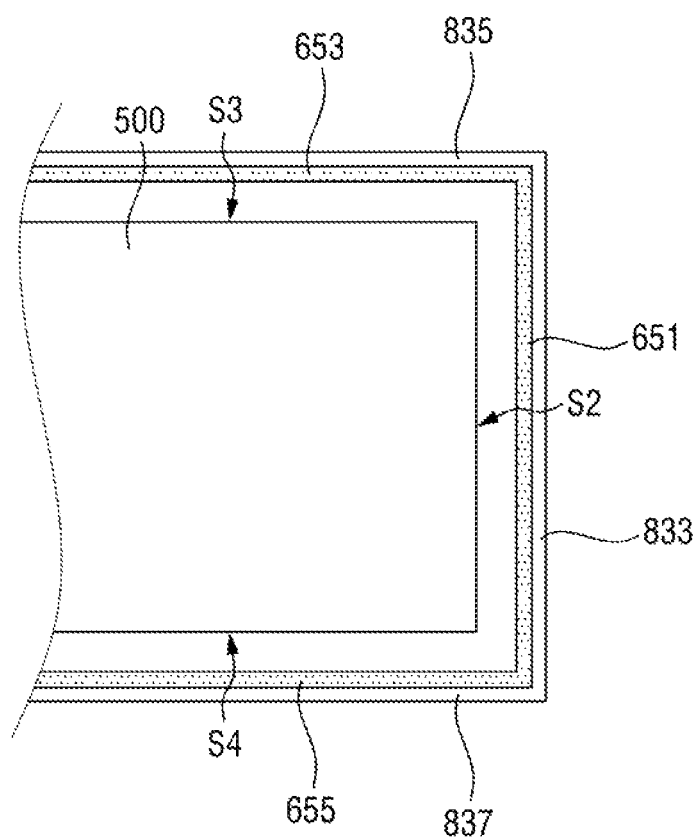
FIG. 27 is a plan view illustrating an arrangement of a light guide plate, the sidewalls of a lower chassis, reflective members, and buffer members in the display device of FIGS. 25 and 26.
Figure 27:
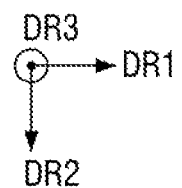
Figure 28:
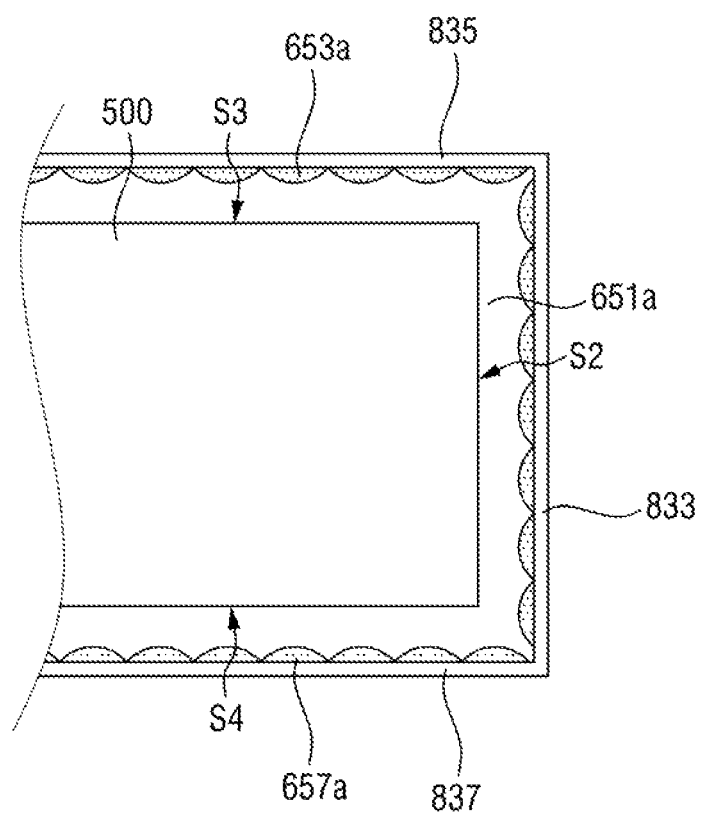
FIG. 28 is a plan view illustrating a modified example of FIG. 27.
Figure 28:
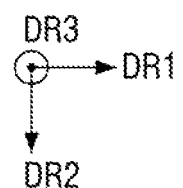

FIG. 25 is a cross-sectional view, taken along line X1-X2 of FIG. 1, of a display device according to an exemplary embodiment of the present disclosure. FIG. 26 is a cross-sectional view, taken along line X3-X4 of FIG. 1, of the display device of FIG. 25. FIG. 27 is a plan view illustrating the arrangement of a light guide plate, the sidewalls of a lower chassis, reflective members, and buffer members in the display device of FIGS. 25 and 26. FIG. 28 is a plan view illustrating a modified example of FIG. 27.

Referring to FIG. 25 through 28, a display device 6 is substantially the same as the display device 5 of FIGS. 20 through 24 except for the locations of first, second, and third buffer members 651, 653, and 655. Thus, the display device 6 will hereinafter be described, focusing mainly on the differences with the display device 5 of FIGS. 20 through 24. Omitted details may therefore be assumed to be at least similar to those described above.

The first buffer member 651 may be coupled to, and placed in contact with a second sidewall 833, which faces a second side surface S2 of a light guide plate 500. The first buffer member 651 might not be placed in contact with, but may be spaced apart from, the second side surface S2.

Similarly, the second buffer member 653 may be coupled to, and placed in contact with a third sidewall 835, which faces a third side surface S3 of the light guide plate 500. The second buffer member 653 might not be placed in contact with, but may be spaced apart from, the third side surface S3.

Similarly, the third buffer member 655 may be coupled to, and placed in contact with a fourth sidewall 837, which faces a fourth side surface S4 of the light guide plate 500. The third buffer member 655 might not be placed in contact with, but may be spaced apart from, the fourth side surface S4.

Figure 29:
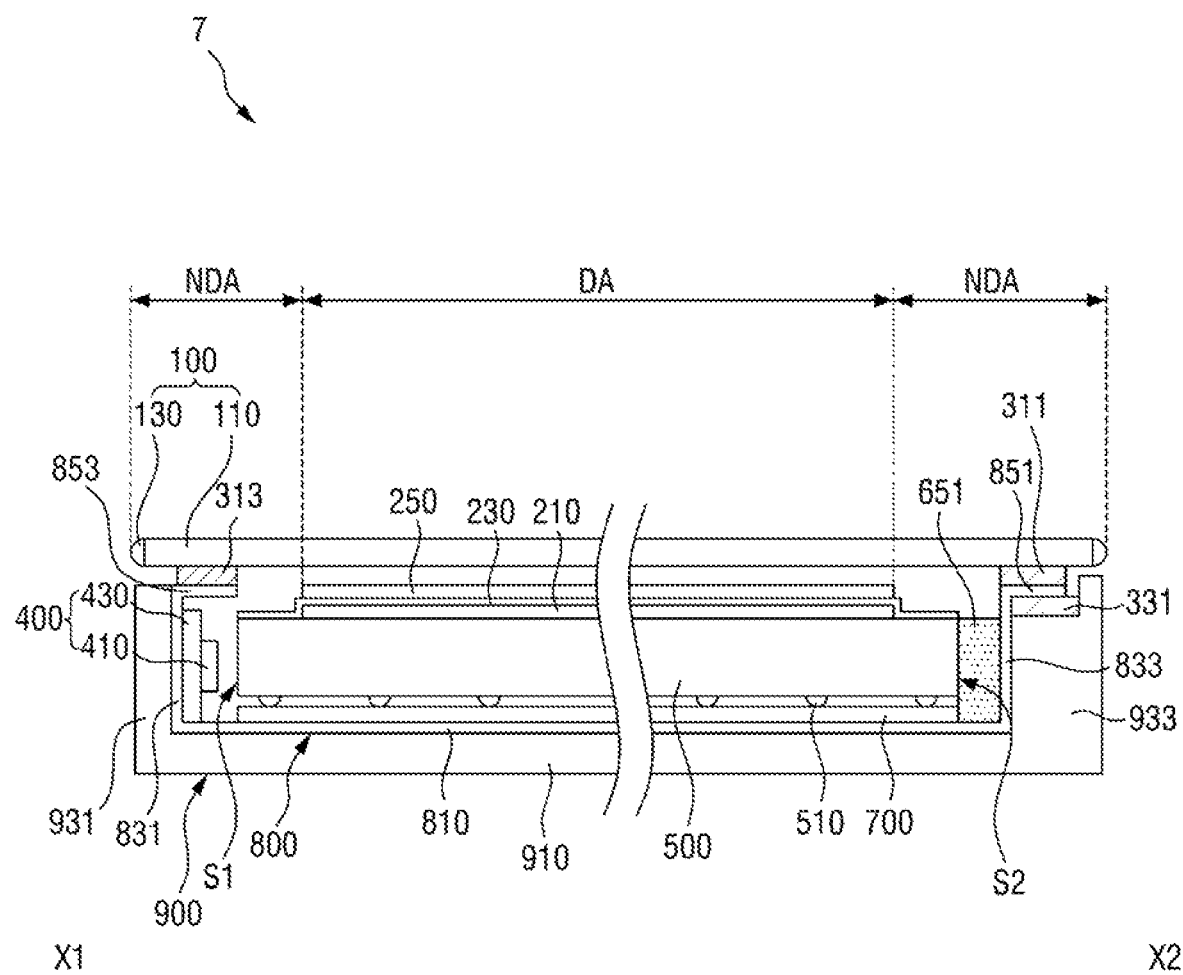
FIG. 29 is a cross-sectional view, taken along line X1-X2 of FIG. 1, of a display device according to an exemplary embodiment of the present disclosure.
Figure 30:
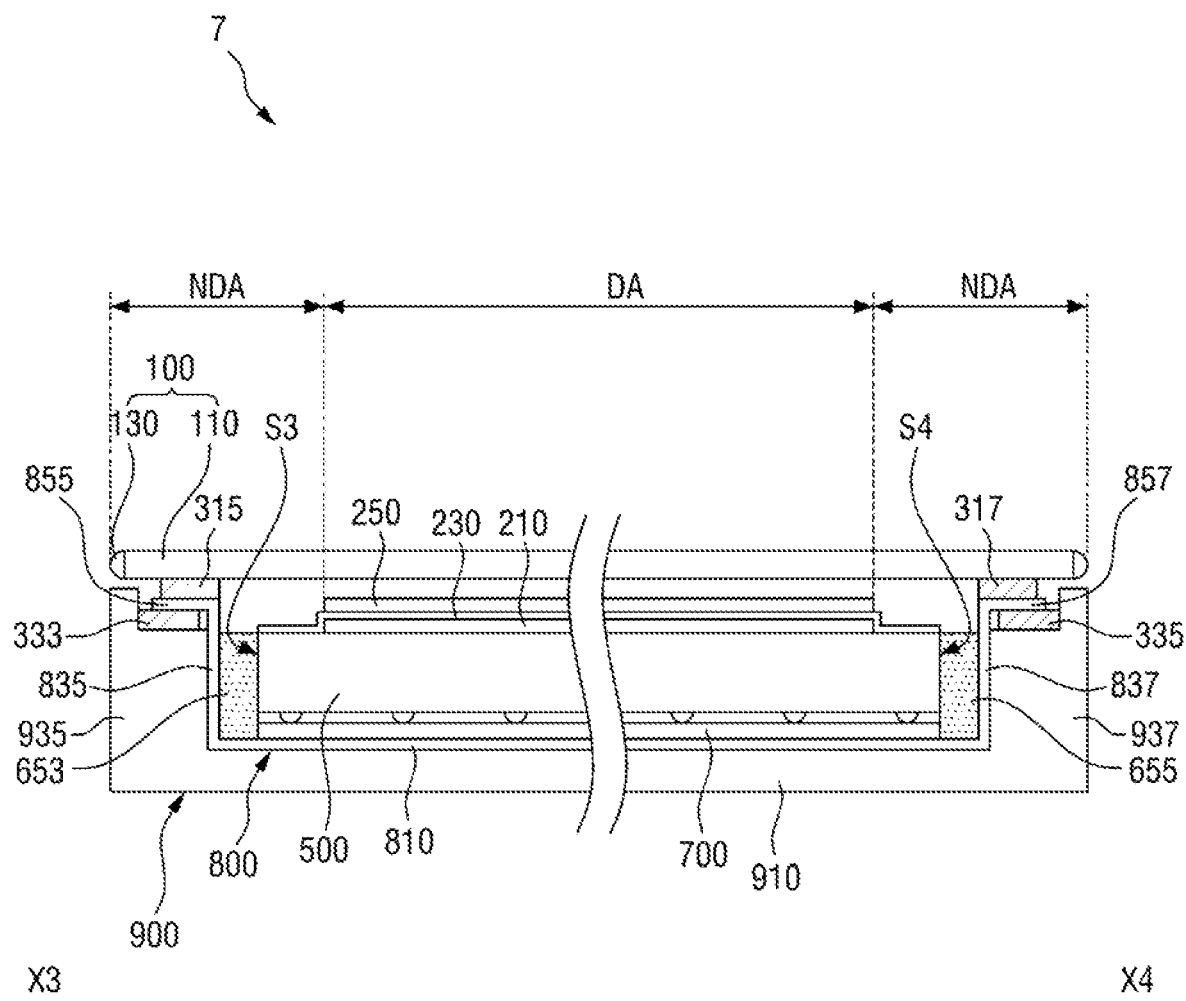
FIG. 30 is a cross-sectional view, taken along line X3-X4 of FIG. 1, of the display device of FIG. 29.

FIG. 29 is a cross-sectional view, taken along line X1-X2 of FIG. 1, of a display device according to an exemplary embodiment of the present disclosure. FIG. 30 is a cross-sectional view, taken along line X3-X4 of FIG. 1, of the display device of FIG. 29.

Referring to FIGS. 29 and 30, a display device 7 is substantially the same as the display device 5 of FIGS. 20 through 24 except for the locations of first, second, and third buffer members 651, 653, and 655. Thus, the display device 7 will hereinafter be described, focusing mainly on the differences with the display device 5 of FIGS. 20 through 24. Omitted details may therefore be assumed to be at least similar to those described above.

The first buffer member 651 may be placed in contact with a second side surface S2 of a light guide plate 500 and a second sidewall 833. In some exemplary embodiments of the present disclosure, the first buffer member 651 may fill the space between the second side surface S2 and the second sidewall 833.

Similarly, the second buffer member 653 may be placed in contact with a third side surface S3 of the light guide plate 500 and a third sidewall 835 and may fill the space between the third side surface S3 and the third sidewall 835. Similarly, the third buffer member 655 may be placed in contact with a fourth side surface S4 of the light guide plate 500 and a fourth sidewall 837 and may fill the space between the fourth side surface S4 and the fourth sidewall 837.

Accordingly, the movement of the light guide plate 500 can be limited or prevented, and damage to the light guide plate 500 can also be reduced or prevented.

Exemplary embodiments described herein are illustrative, and many variations can be introduced without departing from the spirit of the disclosure or from the scope of the appended claims. For example, elements and/or features of different exemplary embodiments may be combined with each other and/or substituted for each other within the scope of this disclosure and appended claims.

What is claimed is:

1. A display device comprising:
    alight guide plate including a first side surface and a second side surface, the light guide plate including an inorganic material;
    a lower chassis including a bottom portion, which overlaps with the light guide plate, a first sidewall, which faces the first side surface of the light guide plate, and a second sidewall, which extends from the bottom portion and faces the second side surface of the light guide plate;
    a light source disposed on the first sidewall and facing the first side surface of the light guide plate;
    a display panel structure disposed on the light guide plate, coupled to the lower chassis via a first panel coupling member, the display panel structure including a display panel;
    a first buffer member, disposed between the second sidewall and the second side surface of the light guide plate; and
    a first reflective member disposed between the first buffer member and the second side surface of the light guide plate,
    wherein the lower chassis further includes a first extension portion, which extends outwardly from the second sidewall, and the first panel coupling member is disposed on the first extension portion and is in contact with both a top surface of the first extension portion and a bottom surface of the display panel.

2. The display device of claim 1, further comprising:
    a second panel coupling member, wherein the lower chassis further includes a second extension portion, which extends inwardly from the first sidewall toward the light guide plate and overlaps with the light source, and the second panel coupling member is disposed on the second extension portion and is in contact with both a top surface of the second extension portion and the bottom surface of the display panel.

3. The display device of claim 1, further comprising:
    a housing disposed below the lower chassis; and
    a first housing coupling member disposed below the first extension portion and in contact with both a bottom surface of the first extension portion and the housing.

4. The display device of claim 1, wherein the first reflective member is in contact with the second side surface of the light guide plate, and the first buffer member is in contact with the first reflective member and is spaced apart from the second sideman.

5. The display device of claim 1, wherein the first reflective member is in contact with the second side surface of the light guide plate, and the first buffer member is in contact with the second sidewall and is spaced apart from the first reflective member.

6. The display device of claim 1, wherein the first reflective member is in contact with the second side surface of the light guide plate, and the first buffer member is in contact with the second sidewall and the first reflective member.

7. The display device of claim 1, wherein the first buffer member is in contact with the second sidewall, and the first reflective member is in contact with the first bullet member and is spaced apart from the second side surface of the light guide plate.

8. The display device of claim 1, further comprising:
    a housing disposed below the lower chassis and completely overlapping the display panel structure.

9. The display device of claim 8, wherein the display panel structure further includes a panel protection member, which is disposed on a side of the display panel.

10. The display device of claim 1, further comprising:
    a wavelength conversion layer disposed on the light guide plate; and
    a passivation layer disposed on the wavelength conversion layer, the passivation layer covering sides of the wavelength conversion layer, and the passivation layer containing an inorganic material,
    wherein the passivation layer is in contact with the light guide plate.

11. The display device of claim 10, wherein the wavelength conversion layer includes quantum dots, and the light source is a blue light source.

12. The display device of claim 10, further comprising:
    a first optical function layer disposed on the passivation layer and having an uneven surface;
    a second optical function layer disposed on the first optical function layer; and
    a low refractive layer disposed between the first and second optical function layers, the low refractive layer planarizing the uneven surface of the first optical function layer, and the low refractive layer coupling the first and second optical function layers,
    wherein the low refractive layer has a lower refractive index than the first optical function layer.

13. The display device of claim 1, further comprising:
    a second buffer member;
    a third buffer member;
    a second reflective ember; and
    a third reflective member,
    wherein the second side surface is opposite to the first side surface, wherein the light guide plate further includes:
    a third side surface, which connects a first end of the first side surface and a first end of the second side surface; and
    a fourth side surface, which connects a second end of the first side surface and a second end of the second side surface,
    wherein the lower chassis further includes: third sidewall, which extends from the bottom portion and faces the third side surface of the light guide plate; and a fourth sidewall, which extends from the bottom portion and faces the fourth side surface of the light guide plate, wherein the second reflective member is disposed between the third side surface of the light guide plate and the third sidewall,
    wherein the second buffer member is disposed between the second reflective member and the third sidewall,
    wherein the third reflective member is disposed between the fourth side surface of the light guide plate and the fourth sidewall, and
    wherein the third buffer member is disposed between the third reflective member and the fourth sidewall.

14. The display device of claim 13, further comprising:
    a third panel coupling member; and
    a fourth panel coupling member, wherein the lower chassis further includes:
    a third extension portion, which extends outwardly from the third side surface of the light guide plate; and a fourth extension portion, which extends outwardly from the fourth side surface of the light guide plate, wherein the third panel coupling member is disposed on the third extension portion and is in contact with both a top surface of the third extension portion and the bottom surface of the display panel, and wherein the fourth panel coupling member is disposed on the fourth extension portion and is in contact with both a top surface of the fourth extension portion and the bottom surface of the display panel.

15. The display device of claim 14, further comprising:
a housing disposed below the lower chassis;
a third housing coupling member disposed below the third extension portion and in contact with both a bottom surface of the third extension portion and the housing; and
a fourth housing coupling member disposed below the fourth extension portion and in contact with both a bottom surface of the fourth extension portion and the housing.

16. A display device comprising:
a light guide plate including a first side surface and a second side surface, the light guide plate comprises an inorganic material;
a lower chassis including a bottom portion, which overlaps with the light guide plate, a first sidewall, which faces the first side surface of the light guide plate, and a second sidewall, which extends from the bottom portion and faces the second side surface of the light guide plate;
a light source disposed on the first sidewall and facing the first side surface of the light guide plate;
a display panel structure disposed on the light guide plate, coupled to the lower chassis via a panel coupling member, and including a display panel; and
a buffer member disposed between the second sidewall and the second side surface of the light guide plate and configured to reflect light emitted from the second side surface of the light guide plate,
wherein the buffer member includes a light-transmitting resin and a lien-reflecting material dispersed within the light-transmitting resin.

17. The display device of claim 16, wherein the buffer member has a convex lens shape in a cross-sectional view.

18. The display device of claim 16, wherein the buffer member includes a plurality of sub-buffer members, each of which is arranged in one direction.

* * * * *